United States Patent
Salazar et al.

(10) Patent No.: US 9,939,488 B2
(45) Date of Patent: Apr. 10, 2018

(54) FIELD TRIAGE OF EOS FAILURES IN SEMICONDUCTOR DEVICES

(71) Applicant: Teseda Corporation, Portland, OR (US)

(72) Inventors: Joseph M. Salazar, Portland, OR (US); Rich Ackerman, Willsonville, OR (US); John Raykowski, Beaverton, OR (US); Armagan Akar, Portland, OR (US); Ralph Sanchez, Amity, OR (US)

(73) Assignee: TESEDA CORPORATION, Portland, OR (US)

( * ) Notice: Subject to any disclaimer, the term of this patent is extended or adjusted under 35 U.S.C. 154(b) by 514 days.

(21) Appl. No.: 14/564,004

(22) Filed: Dec. 8, 2014

(65) Prior Publication Data
US 2015/0149106 A1 May 28, 2015

Related U.S. Application Data

(63) Continuation-in-part of application No. 13/223,059, filed on Aug. 31, 2011, now Pat. No. 8,907,697.

(51) Int. Cl.
*G01R 31/317* (2006.01)
(52) U.S. Cl.
CPC .............. *G01R 31/31715* (2013.01)
(58) Field of Classification Search
CPC ................... G01R 31/31715; G06F 8/51
USPC .......................................... 702/117; 717/137
See application file for complete search history.

(56) References Cited

U.S. PATENT DOCUMENTS

| | | | |
|---|---|---|---|
| 2,883,255 A | 4/1959 | Anderson | |
| 3,082,374 A | 3/1963 | Buuck | |
| 4,012,625 A | 3/1977 | Bowen | |
| 4,434,489 A | 2/1984 | Blyth | |
| 4,646,299 A | 2/1987 | Schinabeck | |
| 4,928,278 A | 5/1990 | Otsuji et al. | |
| 5,159,369 A * | 10/1992 | Hashimoto | G01R 31/002 324/537 |

(Continued)

FOREIGN PATENT DOCUMENTS

| | | |
|---|---|---|
| EP | 0 283 610 A | 9/1988 |
| EP | 0 687 977 A2 | 12/1995 |

OTHER PUBLICATIONS

Per Pin Parametric Measurement Unit/Source Measure Unit: Analog Devices, Inc.; Sep. 2005; 24 pages.

(Continued)

*Primary Examiner* — Michael Tran
(74) *Attorney, Agent, or Firm* — Fisherbroyles LLP; Micah D. Stolowitz

(57) ABSTRACT

Automated test procedures, carried out under software control, can be employed to test a device, testing individual pins, and/or groups of pins, to detect and diagnose or characterize various types of failures. A distributed FA system includes a shared database for device definitions, test setups, and test results. Test platforms provide I/O curve tracing which can provide both a qualitative visual representation and a quantitative measured performance. The disclosed system enables and exploits front line testing of devices in the field. Response to the customer can be nearly immediate. Eliminate "false returns" by differentiation of use versus a real quality issue.

9 Claims, 18 Drawing Sheets

(56) References Cited

U.S. PATENT DOCUMENTS

| | | | |
|---|---|---|---|
| 5,285,453 A * | 2/1994 | Gruodis | G01R 31/31813 714/726 |
| 5,490,151 A | 2/1996 | Feger | |
| 5,497,381 A * | 3/1996 | O'Donoghue | H01L 22/20 257/E21.525 |
| 5,696,771 A | 12/1997 | Beausang | |
| 5,717,701 A | 2/1998 | Angelotti | |
| 5,909,450 A * | 6/1999 | Wright | G01R 31/31908 714/724 |
| 6,185,707 B1 | 2/2001 | Smith | |
| 6,275,023 B1 | 8/2001 | Oosaki et al. | |
| 6,366,109 B1 * | 4/2002 | Matsushita | G01R 31/31926 324/750.01 |
| 6,415,977 B1 * | 7/2002 | Rumsey | H01L 23/544 235/454 |
| 6,498,473 B1 | 12/2002 | Yamabe | |
| 6,618,827 B1 | 9/2003 | Benavides | |
| 6,628,141 B1 | 9/2003 | Alt | |
| 6,775,796 B2 | 8/2004 | Finkler | |
| 6,832,122 B1 | 12/2004 | Huber | |
| 6,836,136 B2 | 12/2004 | Aghaeepour | |
| 6,882,950 B1 | 4/2005 | Jennion | |
| 6,883,115 B2 | 4/2005 | Sanada | |
| 6,950,771 B1 | 9/2005 | Fan | |
| 7,012,444 B2 | 3/2006 | Kojima | |
| 7,071,833 B2 | 7/2006 | Nagano | |
| 7,266,741 B2 | 9/2007 | Luk | |
| 7,320,115 B2 | 1/2008 | Kuo | |
| 7,512,508 B2 | 3/2009 | Rajski | |
| 7,568,139 B2 | 7/2009 | Dokken | |
| 7,571,422 B2 | 8/2009 | Adel | |
| 7,574,682 B2 | 8/2009 | Riviere-Cazaux | |
| 7,705,622 B1 * | 4/2010 | Grund | G01R 31/2625 324/750.3 |
| 7,729,884 B2 | 6/2010 | Huang | |
| 7,752,581 B2 | 7/2010 | Lanzerotti | |
| 7,876,120 B2 | 1/2011 | Awajl et al. | |
| 7,987,442 B2 | 7/2011 | Rajski | |
| 8,141,026 B1 | 3/2012 | Reilly | |
| 8,205,173 B2 | 6/2012 | Wu | |
| 8,343,781 B2 | 1/2013 | Kumar | |
| 8,412,991 B2 | 4/2013 | Ackerman | |
| 8,453,088 B2 | 5/2013 | Akar | |
| 8,539,389 B2 | 9/2013 | Akar | |
| 8,560,904 B2 | 10/2013 | Ackerman | |
| 8,626,460 B2 | 1/2014 | Kaufman et al. | |
| 8,918,753 B2 | 12/2014 | Akar | |
| 2003/0038365 A1 * | 2/2003 | Farnworth | H01L 23/544 257/723 |
| 2003/0046621 A1 | 3/2003 | Finkler | |
| 2003/0046624 A1 | 3/2003 | Muhtaroglu | |
| 2003/0057990 A1 | 3/2003 | West | |
| 2004/0049722 A1 | 3/2004 | Matsushita | |
| 2004/0078165 A1 * | 4/2004 | Kellerman | G01R 31/31912 702/119 |
| 2004/0225459 A1 * | 11/2004 | Krishnaswamy | G01R 31/3183 702/57 |
| 2005/0024062 A1 * | 2/2005 | Washizu | G01R 31/31919 324/500 |
| 2005/0066294 A1 | 3/2005 | Templeton | |
| 2005/0071659 A1 | 3/2005 | Ferguson | |
| 2005/0076316 A1 | 4/2005 | Pierrat | |
| 2005/0154550 A1 * | 7/2005 | Singh | G01R 31/3183 702/108 |
| 2005/0270165 A1 | 12/2005 | Nagano | |
| 2005/0278670 A1 * | 12/2005 | Brooks | G05B 19/409 703/6 |
| 2005/0283664 A1 * | 12/2005 | Coulter, Jr. | G06F 11/261 714/15 |
| 2006/0031792 A1 | 2/2006 | Zavadsky | |
| 2006/0053357 A1 | 3/2006 | Rajski | |
| 2006/0066338 A1 | 3/2006 | Rajski | |
| 2006/0066339 A1 | 3/2006 | Rajski | |
| 2006/0085768 A1 | 4/2006 | Heng | |
| 2006/0111873 A1 | 5/2006 | Huang | |
| 2006/0123287 A1 * | 6/2006 | Tan | G01R 31/2837 714/724 |
| 2006/0132165 A1 | 6/2006 | Walker et al. | |
| 2006/0132166 A1 | 6/2006 | Walker | |
| 2006/0150041 A1 * | 7/2006 | Yacobucci | G01R 31/318544 714/726 |
| 2006/0161452 A1 | 7/2006 | Hess | |
| 2006/0279310 A1 * | 12/2006 | Walker | G01R 31/31924 324/762.01 |
| 2007/0011519 A1 | 1/2007 | Takeda | |
| 2007/0016879 A1 | 1/2007 | Kuo | |
| 2007/0143718 A1 | 6/2007 | Abercrombie | |
| 2007/0226570 A1 | 9/2007 | Zou | |
| 2008/0040637 A1 | 2/2008 | Huang | |
| 2008/0091981 A1 | 4/2008 | Dokken | |
| 2008/0148201 A1 | 6/2008 | Lanzerotti | |
| 2008/0209365 A1 | 8/2008 | Riviere-Cazaux | |
| 2008/0284453 A1 | 11/2008 | Swenton | |
| 2009/0134880 A1 * | 5/2009 | Grund | G01R 31/002 324/537 |
| 2009/0177936 A1 | 7/2009 | Koenemann | |
| 2009/0210183 A1 | 8/2009 | Rajski | |
| 2009/0219035 A1 * | 9/2009 | Apte | G09G 3/006 324/555 |
| 2009/0254887 A1 * | 10/2009 | Rossi | G06F 11/3688 717/126 |
| 2009/0326697 A1 * | 12/2009 | Xu | G03F 1/68 700/103 |
| 2010/0095177 A1 | 4/2010 | Forlenza | |
| 2010/0100859 A1 * | 4/2010 | Ito | G06F 17/5036 716/106 |
| 2010/0122229 A1 | 5/2010 | Lo | |
| 2010/0164013 A1 | 7/2010 | Jaffe | |
| 2010/0227305 A1 * | 9/2010 | Bakir | G09B 7/00 434/350 |
| 2010/0306606 A1 | 12/2010 | Huang | |
| 2010/0332172 A1 | 12/2010 | Kaufman | |
| 2011/0031990 A1 * | 2/2011 | Patterson | G01R 1/0408 324/755.05 |
| 2011/0031993 A1 * | 2/2011 | Patterson | G01R 31/2837 324/762.07 |
| 2011/0219346 A1 | 9/2011 | Lo | |
| 2011/0231722 A1 | 9/2011 | Mukherjee | |
| 2011/0265157 A1 | 10/2011 | Ryder | |
| 2011/0276935 A1 | 11/2011 | Fouquet | |
| 2012/0079439 A1 | 3/2012 | Akar | |
| 2012/0079440 A1 | 3/2012 | Akar | |
| 2012/0079442 A1 | 3/2012 | Akar | |
| 2012/0161808 A1 | 6/2012 | Elias | |
| 2013/0049790 A1 | 2/2013 | Frost | |
| 2013/0061103 A1 | 3/2013 | Ackerman | |
| 2013/0219237 A1 | 8/2013 | Ackerman | |
| 2014/0046457 A1 * | 2/2014 | Taber | G05B 19/056 700/2 |
| 2014/0068570 A1 * | 3/2014 | Cox | G06F 8/44 717/137 |
| 2014/0115412 A1 | 4/2014 | Ackerman | |
| 2014/0115551 A1 | 4/2014 | Akar | |
| 2014/0201126 A1 * | 7/2014 | Zadeh | G06K 9/627 706/52 |
| 2016/0055327 A1 * | 2/2016 | Moran | G06F 21/32 726/19 |
| 2016/0110523 A1 * | 4/2016 | Francois | G06Q 50/24 705/2 |

OTHER PUBLICATIONS

Kashyap, Chandramouli et al., "Silicon feedback to improve frequency of high-performance microprocessors—an overview"; Published in Proceedings ICCAD '08 Proceedings of the 2008 IEEE/ACM International Conference on Computer-Aided Design; 2008; 5 pages.

(56) References Cited

OTHER PUBLICATIONS

Schwabe, Williamson & Wyatt; Related Case Listing; Portland, OR; Feb. 4, 2017; 2 pages.

* cited by examiner

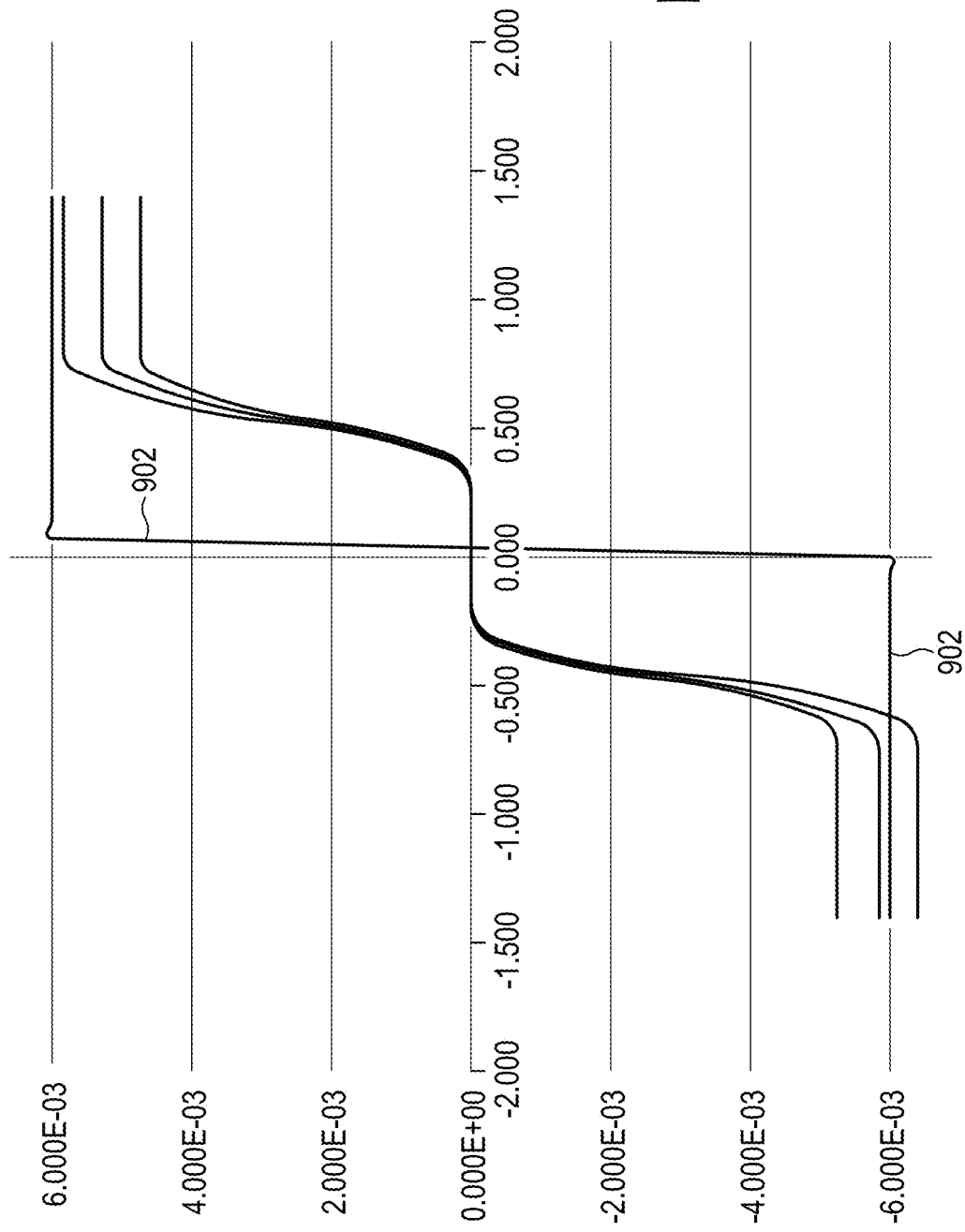

FIELD TRIAGE OF EOS FAILURES IN SEMICONDUCTOR DEVICES

RELATED APPLICATIONS

This application is a Continuation-in-Part of application Ser. No. 13/223,059 filed Aug. 31, 2011, now issued as U.S. Pat. No. 8,907,697, and incorporated herein by this reference.

COPYRIGHT NOTICE

© 2013-2014 Teseda Corporation. A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR § 1.71(d).

TECHNICAL FIELD

This invention pertains to methods and apparatus for defect isolation and testing of semiconductor integrated circuits in the field. More specifically, this disclosure pertains to rapid failed device screening in remote field locations.

BACKGROUND OF THE INVENTION

It can be difficult to screen semiconductor devices for functionality. Defects observed at the package interface may cause the entire device to fail. Previous approaches to determining whether a device is functional include wafer sort and final packaged testing. However, because the test equipment associated with such tests is often expensive, sophisticated capital equipment, the tests themselves become expensive, with the cost of the test increasing with test duration.

Further, even after devices have been packaged, tested and shipped, they are not all perfect, and failures do occur in the field, by which we mean locations remote from the manufacturer of the devices. For example, a "field location" may refer to the facilities of a customer, distributor, or an end user. A field location may be a sales office of the IC manufacturer. Conventionally, suspect or failed devices have to be shipped from a field location back to the manufacturer in order to evaluate them, often incurring the expenses and delays that are typically associated with international shipments.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present disclosure is directed, in one aspect, to various embodiments of a testing system or device for testing semiconductor integrated circuits ("ICs"). In some cases, the disclosure is well suited to high pin count devices, for example, devices having more than around 100 pins. Automated test procedures, carried out under software control, can be employed to test a device, testing individual pins, and/or groups of pins, to detect and diagnose or characterize various types of failures. For example, EOS events will typically cause either opens or shorts to occur on individual pins or a group of pins. In the case of opens, current will no longer be able to flow from the pin to its desired location.

The end customers of newly built systems want to verify that all the components are of a consistent quality and that they were not damaged during shipment or assembly. These are all potential applications for I/O curve tracing which can provide both a qualitative visual representation and a quantitative measured performance. The disclosed system enables and exploits front line testing of devices in the field for all these reasons. Response to the customer can be nearly immediate. Eliminate "false returns" by differentiation of use versus a real quality issue. Measurement data curves are saved electronically, eliminating manual data recording errors, for documentation and later recall for further analysis. The stored test data can be accessed from a common database by designers, process engineers, FA people, as well as customer application engineers as needed. In an example, factory FA people can review test results (from the common database) to evaluate an initial quality prognosis without waiting for returned materials or samples to arrive and conducting the tests themselves. Response times are dramatically reduced by utilizing the systems and methods disclosed herein.

Additional aspects and advantages of this invention will be apparent from the following detailed description of preferred embodiments, which proceeds with reference to the accompanying drawings.

BRIEF DESCRIPTION OF THE DRAWINGS

FIG. 9A is a voltage-current curve trace illustrating a resistive bridge with blown open diodes.

DETAILED DESCRIPTION OF PREFERRED EMBODIMENTS

Figure 1:
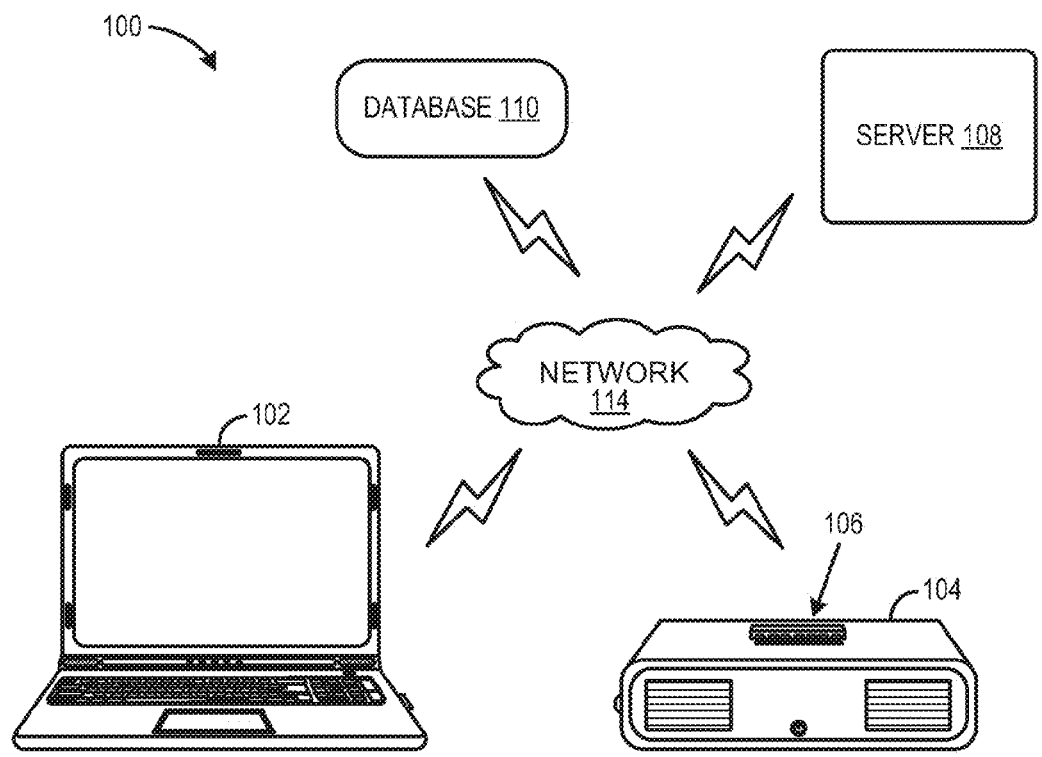
FIG. 1 schematically shows an example system for testing a semiconductor device according to an embodiment of the present disclosure.

Electrical Over-Stress (EOS) events will typically cause either opens or shorts to occur on individual pins or a group of pins of an integrated circuit. In the case of opens, current will no longer be able to flow from the pin to its desired location. Typically a continuity measurement is sufficient to detect these failures because they cause failures in the bonding or the electro-static discharge (ESD) protection diodes. There are occurrences when an EOS event will cause a partial open or degradation in the performance of the protection circuitry. These failures require a curve trace to identify the failure. Shorts can occur between a pin(s) and another pin(s), the pin(s) and ground, or the pin(s) and a power supply. Adequately detecting and characterizing these failures requires a pin-to-pin curve trace.

Defects occurring during semiconductor manufacturing may cause functional faults in semiconductor devices. For example, manufacturing faults like open circuit defects, impurity defects, and packaging defects may cause faults potentially leading to poor device performance or device failure. Semiconductor devices may be tested at an electrical test and/or sort facility using automated test equipment (ATE) to determine if the device is logically functional. Depending on the logical function of the device, additional techniques may be used to analyze specific failure modes of the device and/or to investigate the electrical character of the device. For example, pin characterization equipment may be used to characterize various electrical properties of electrical pins of the semiconductor device. However, existing approaches to characterizing pin electrical properties generally do not provide logic function test capability.

The disclosed embodiments relate to systems and methods for electrically characterizing a semiconductor device. For example, a computer-readable storage medium excluding a signal per se and comprising instructions stored thereon that are executable by a computing device to electrically characterize pins included in the semiconductor device is disclosed. The example instructions comprise instructions to provide a test pattern to the semiconductor device via one or more of the pins, the test pattern configured to set the semiconductor device to a selected logical state prior to electrically characterizing a selected pin. The example instructions also comprise instructions to adjust an electrical state of the selected pin after the test pattern is provided to the device, generate an electrical characterization for the selected pin, and output the electrical characterization for display.

The disclosed embodiments may provide an approach to characterize the electrical behavior of one or more pins included in a semiconductor device rapidly. Further, in some embodiments, the system and methods described herein may provide a compact approach to checking device functionality without the overhead of traditional ATE hardware. For example, in some embodiments, the hardware and software described herein may be implemented in a portable and/or compact manner.

Figure 2:
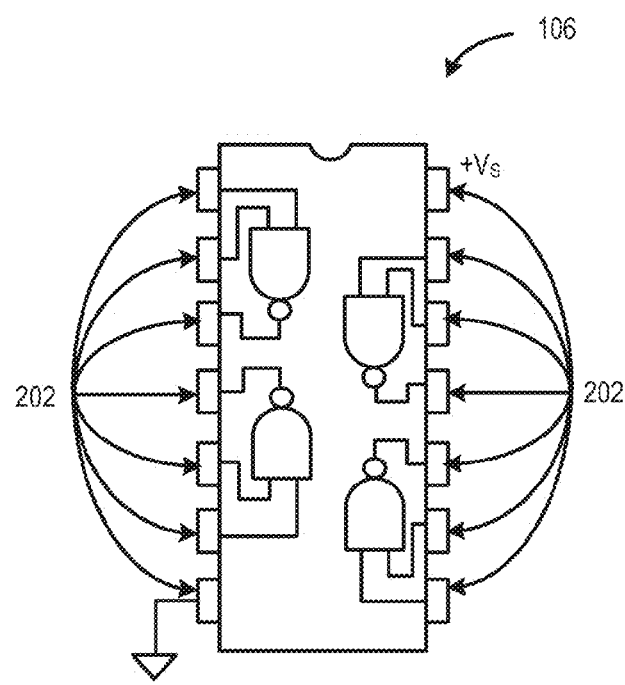
FIG. 2 schematically shows an example semiconductor device that may be tested using the system of FIG. 1.

FIG. 1 schematically shows an embodiment of a system 100 for testing a semiconductor device and FIG. 2 schematically shows an embodiment of a semiconductor device 106 that may be tested using system 100 of FIG. 1. Semiconductor device 106 may be virtually any suitable semiconductor device, including, digital devices, analog devices, and devices including digital and analog subsystems. As shown, semiconductor device 106 includes a plurality of pins 202. Any suitable number of pins included in semiconductor device 106 may be characterized by the embodiments described herein. For example, in some embodiments, semiconductor devices having 348 pins, 512 pins, or more pins may be characterized and tested using the described embodiments.

As shown in FIG. 1, system 100 includes a characterization computing device 102, a test unit 104, a server 108, a database 110, and a network 114. As described in more detail below, characterization computing device 102 generates an electrical characterization of one or more pins of semiconductor device 106 using data measured by test unit 104. The electrical characterization generated may be virtually any suitable electrical characterization. In some embodiments, the electrical characterization may include a direct current or voltage characterization of a pin. Other suitable electrical characterizations include, but are not limited to, continuity tests, and input leakage current measurements performed at a pin under test.

Characterization computing device 102 may receive data for characterizing semiconductor device 106 and comparing the characterization generated to characterizations for other devices (such as statistical baseline data, "golden device" test results, manufacturing specification data, device performance data, and the like) from server 108 and/or database 110 via network 114. While FIG. 1 depicts a client/server model, it will be appreciated that the client/server model is provided for illustrative purposes only, and that any suitable computing model for provisioning characterization computing device 102 with such data may be employed without departing from the scope of the present disclosure. For example, in some embodiments, a cloud computing model may be employed, while in other embodiments database 110 and test unit 104 may be included with characterization computing device 102 in a shared housing.

Figure 3:
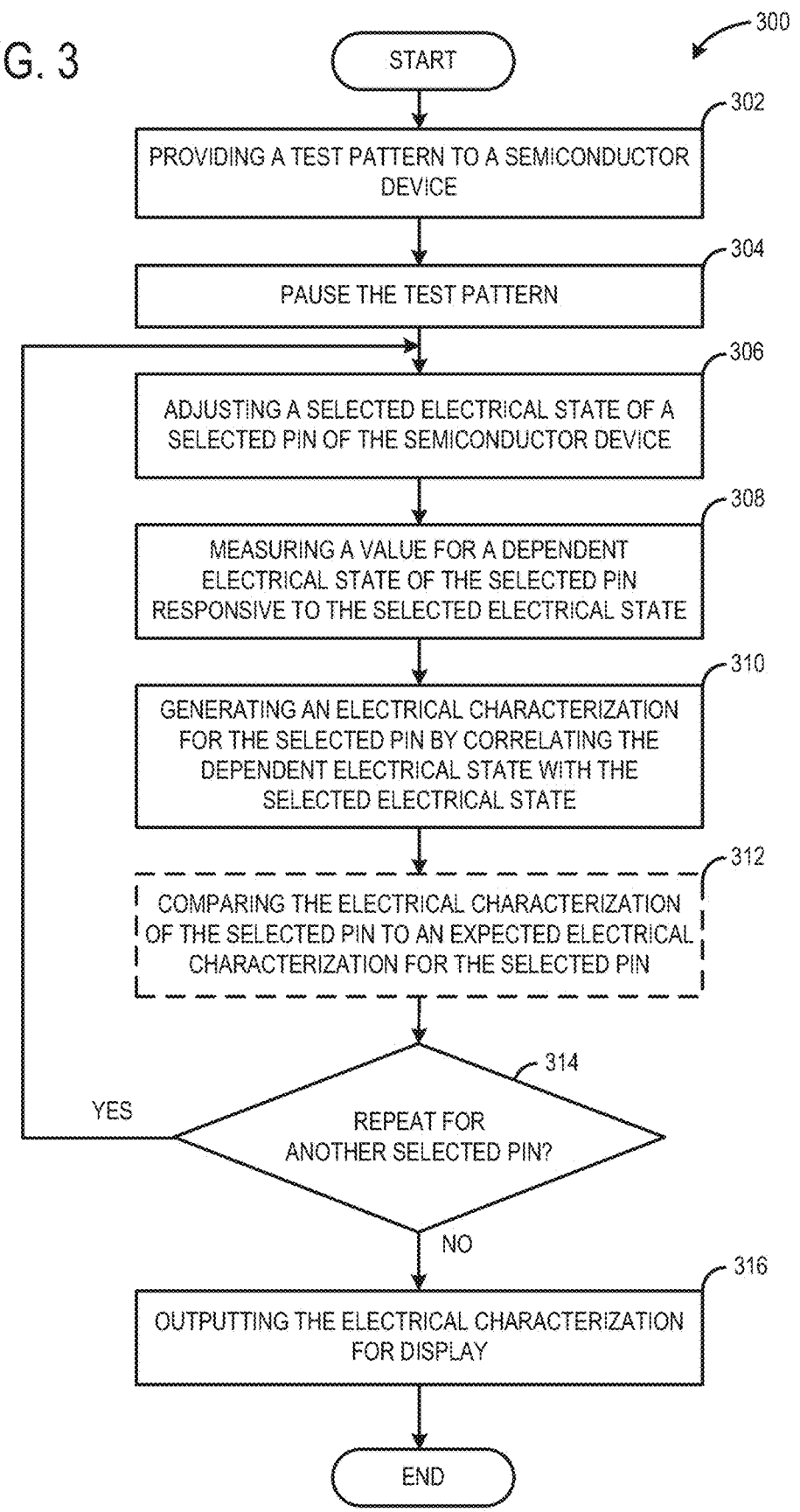
FIG. 3 shows a flowchart for a method for electrically characterizing a semiconductor device according to an embodiment of the present disclosure.

FIG. 3 shows a flowchart for an embodiment of a method 300 for electrically characterizing a semiconductor device. Method 300 comprises, at 302, providing a test pattern to a semiconductor device. The test pattern is provided to set one or more pins of the device to selected respective logical states prior to electrical characterization. For example, the test pattern may be used to set various pins of the device, other than a particular pin under test selected for characterization, to predetermined respective logical states before the particular pin is characterized. In some embodiments, the test pattern may be a sequence of 1 s (e.g., logic highs) and 0 s (e.g., logic lows) provided as input to the semiconductor device via various input pins, power pins, ground pins, and the like. Once the test pattern is applied, the logical state of the semiconductor device may be known, and, because the logical state of the semiconductor device may be known, the electrical characterization of the pin may be performed to determine whether the electrical characteristics of the pin are within expected tolerances.

In some embodiments, providing the test pattern to the semiconductor device may include setting one or more pins of the semiconductor device to a logic low state while a pin selected for electrical characterization is characterized. In some embodiments, setting a pin to a logic low state may include setting the pin to a D.C. voltage of 0.8 V or less, within an acceptable tolerance. In some embodiments, setting the pins to a logic low may include setting the pins to a ground state. Setting the pins to a ground state may be performed prior to performing the selected characterization techniques on the selected pin. For example, setting the semiconductor device to a ground state may be performed prior to performing a voltage-current characterization of the selected pin and/or a continuity characterization for the selected pin, as described further below.

In some other embodiments, providing the test pattern to the semiconductor device may include setting one or more pins of the semiconductor device to a logic high state while the selected pin is characterized. In some embodiments, setting such pins to a logic high state may include setting the pins to a D.C. voltage of 2.5 V, within an acceptable tolerance. For example, using a test pattern to set the semiconductor device to the powered state may enable an input leakage determination as described below.

At 304, method 300 includes pausing the test pattern while the pin selected for electrical characterization is characterized. Pausing the test pattern provides a D.C. state for characterization of the selected pin. Thus, the test pattern is paused to adjust the selected electrical state and measure the value for the dependent electrical state for the selected pin. It will be appreciated that the test pattern may be paused for any suitable period of time. In one example, the test pattern may be paused for less than 100 milliseconds while the dependent electrical state is measured.

At 306, method 300 includes adjusting a selected electrical state of the selected pin of the semiconductor device, and, at 308, measuring a value for a dependent electrical state of the selected pin responsive to the selected electrical state. For example, a test unit configured to perform an electrical measurement of the semiconductor device may adjust the selected electrical state of the selected pin and measure the dependent electrical state of the selected pin in response. It will be appreciated that selection and adjustment of the electrical state may be performed in any suitable way. For example, in some embodiments, a value for the electrical state may be selected and provided as a stimulus to the selected pin and a response of the selected pin may be detected and measured by a suitable sensor in response. The selected value may be incremented and/or indexed through a selected range of values in some embodiments, while the selected value may be a single value in some other embodiments.

At 308, method 300 includes generating an electrical characterization for the pin by correlating the dependent electrical state with the selected electrical state. For example, a correlation may be formed from one or more selected electrical state values provided to the pin and the respective dependent electrical state values measured in response. Any suitable manner of correlating the dependent electrical state to the electrical state may be employed without departing from the scope of the present disclosure. In some embodiments, a plurality of correlations may be generated from the data along with statistical information related to the quality of the correlation, such as a correlation coefficient, for each, potentially allowing judgments to be made about outlier data points, various defect modes that may be identifiable via various correlation techniques, and so on.

Various examples of electrical characterizations that may be generated and the electrical state adjustments and dependent electrical state measurements are described below. For example, a voltage-current characterization may be generated using current measurements made in response to voltage adjustments to a selected pin. In this example, adjusting the selected electrical state of the selected pin may include adjusting a selected voltage incrementally within a selected voltage range. For example, one non-limiting voltage range may include voltages selected in the range from −1.4 V to +1.4 V selected in increments of 0.1 V. Measuring the value for the dependent electrical state of the selected pin in this example may include measuring a current value at the selected pin for each voltage setting. The measurement values may be stored in a database. Once the current measurements are collected, the voltage-current characterization may be generated by suitably correlating the current measurements with their respective voltage settings. In some embodiments, generating the voltage-current relationship for the selected pin may include setting one or more pins other than the selected pin to a logic low state prior to adjusting the voltage of the selected pin. For example, each pin other than the selected pin may be set to a logic low state prior to adjusting the voltage of the selected pin. In some other embodiments, each of a plurality of pins other than the selected pin may be set to logic high and/or logic low states respectively prior to adjusting the voltage of the selected pin.

In another example, an input leakage characterization may be generated for a selected pin. In this example, adjusting the selected electrical state of the selected pin may include selecting a voltage and measuring the value for the dependent electrical state may include measuring a current value in response. For example, a selected pin may be set to a voltage of 3.3 V and a current may be measured at the selected pin. Once the current measurement is collected, the input leakage characterization may be generated by suitably correlating the current measurement with the voltage setting. In some embodiments, generating the voltage-current relationship for the selected pin may include setting one or more pins other than the selected pin to a powered state prior to adjusting the selected voltage of the selected pin. For example, each power pin other than the selected pin may be set to a powered state prior to adjusting the voltage of the selected pin.

In yet another example, a pin continuity characterization may be generated for a selected pin. In this example, adjusting the selected electrical state of the selected pin may include selecting a current and measuring the value for the dependent electrical state of the selected pin may include measuring a voltage value in response. For example, a selected pin may be set to a current of −1.0 μA and a voltage may be measured at the selected pin. Once the voltage measurement is collected, the continuity characterization may be generated by suitably correlating the voltage measurement with the current setting. In some embodiments, generating the voltage-current relationship for the selected pin may include setting one or more pins other than the selected pin to a logic low state prior to adjusting the selected current. For example, each pin other than the selected pin may be set to an unpowered state prior to adjusting the current of the selected pin.

At 310, method 300 may optionally include comparing the electrical characterization for the selected pin to an expected or reference electrical characterization for the selected pin. Comparing the characterization for the selected pin to an expected characterization may provide an approach for determining whether the selected pin has acceptable pin characteristics. Such judgments may be made by comparing inflection points, slopes, and/or other suitable features of the generated characterization and/or the correlation underlying the generated characterization to the reference. Further, comparison of the characterization generated for the selected pin to a reference characterization may provide an approach for diagnosing potential failure mechanisms if the selected pin is faulty. For example, differences between the characterizations for the selected pin and the expected electrical characterization may indicate further tests that may be performed, potential causes for the fault, and so on. Any suitable expected electrical characterization may be used for comparison without departing from the scope of the present disclosure. In some embodiments, the expected electrical characterization may have been generated from a previously tested pin on the device under test, from a reference or "golden" device, from a simulation or theory, from a relevant industry standard, and the like.

In some embodiments, the semiconductor device may include a plurality of pins that may be selected for characterization. In such embodiments, method 300 may be repeated to characterize the additional selected pins. Accordingly, at 312, method 300 includes determining if portions of method 300 are to be repeated for another pin under test. If an additional pin is selected for characterization, method 300 returns to 304. In some embodiments, a plurality of pins of the semiconductor device may be tested according to a predetermined sequence. It will be appreciated that any suitable sequence may be used for characterizing the pins. For example, the pins may be tested according to a suitable pin identifier. If no additional pins are selected for characterization, method 300 continues to 314. At 314, method 300 includes, at 314, outputting the electrical characterization for display. Virtually any suitable display output may be employed without departing from the scope of the present disclosure. In some embodiments, the displayed output may be presented in a customizable format and/or in various graphical and/or tabular displays as described below.

Figure 4:
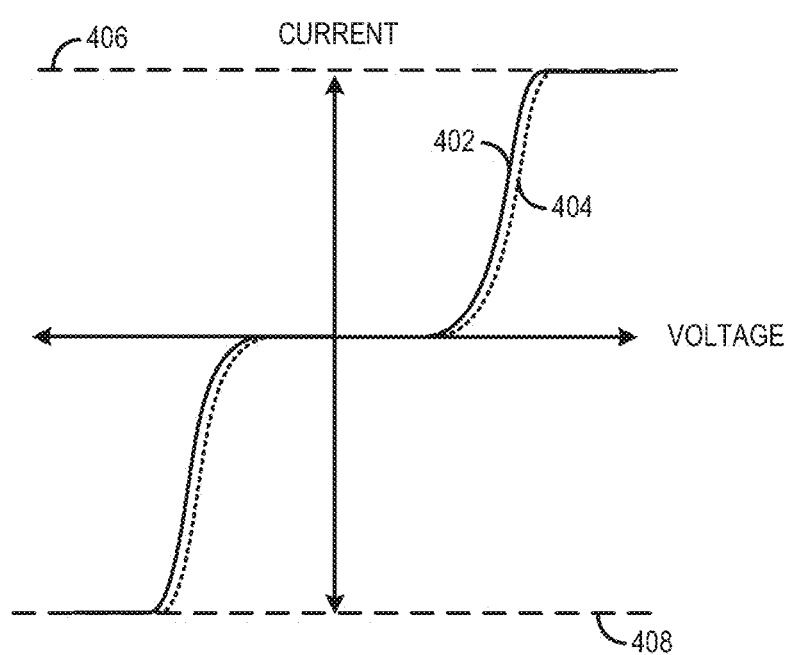
FIG. 4 shows a graphical representation of a voltage-current characterization that may be output for display according to an embodiment of the present disclosure.

In some embodiments, a graphical comparison of generated and expected electrical characterizations for a selected pin or pins may be output for display. FIG. 4 schematically shows an embodiment of a graphical representation of a generated electrical characterization 402 for a selected pin and an example expected electrical characterization 404 associated with that pin. The graphical representation shown in FIG. 4 illustrates an example voltage-current relationship for the selected pin. As shown in FIG. 4, generated electrical characterization 402 overlays expected electrical characterization 404 on a common axis. Presenting electrical characterizations 402 and 404 in this manner may make it visually apparent whether the electrical characteristics of the selected pin are within an acceptable tolerance of a reference electrical characteristic. FIG. 4 also shows a high threshold 406 and a low threshold 408. In some embodiments, high threshold 406 may represent an upper rail for protecting the test unit from excess current while low threshold 408 may represent a lower rail from excess current or vice versa. A graphical display of the type illustrated here may be displayed on an electronic display screen, for example, of a computing device 102.

Continuing with regard to FIG. 3, in some embodiments, an electrical characterization may be output in tabular form. For example, a data table output for display may include the electrical characterization and one or more values for the selected electrical state of the selected pin or pins and corresponding values measured for the dependent electrical state of the selected pin or pins from which the electrical characterization was generated. Further, the data table may include comparisons to expected electrical characterization for one or more selected pins, information about a test pattern provided to the device under test prior to performing the characterization, and so on. It will be appreciated that method 300 is provided by way of example and as such is not meant to be limiting. Method 300 may include additional or alternative steps that those shown in FIG. 3. Further, the methods described herein may be performed by any suitable hardware and/or software, including the hardware described herein.

Figure 5:
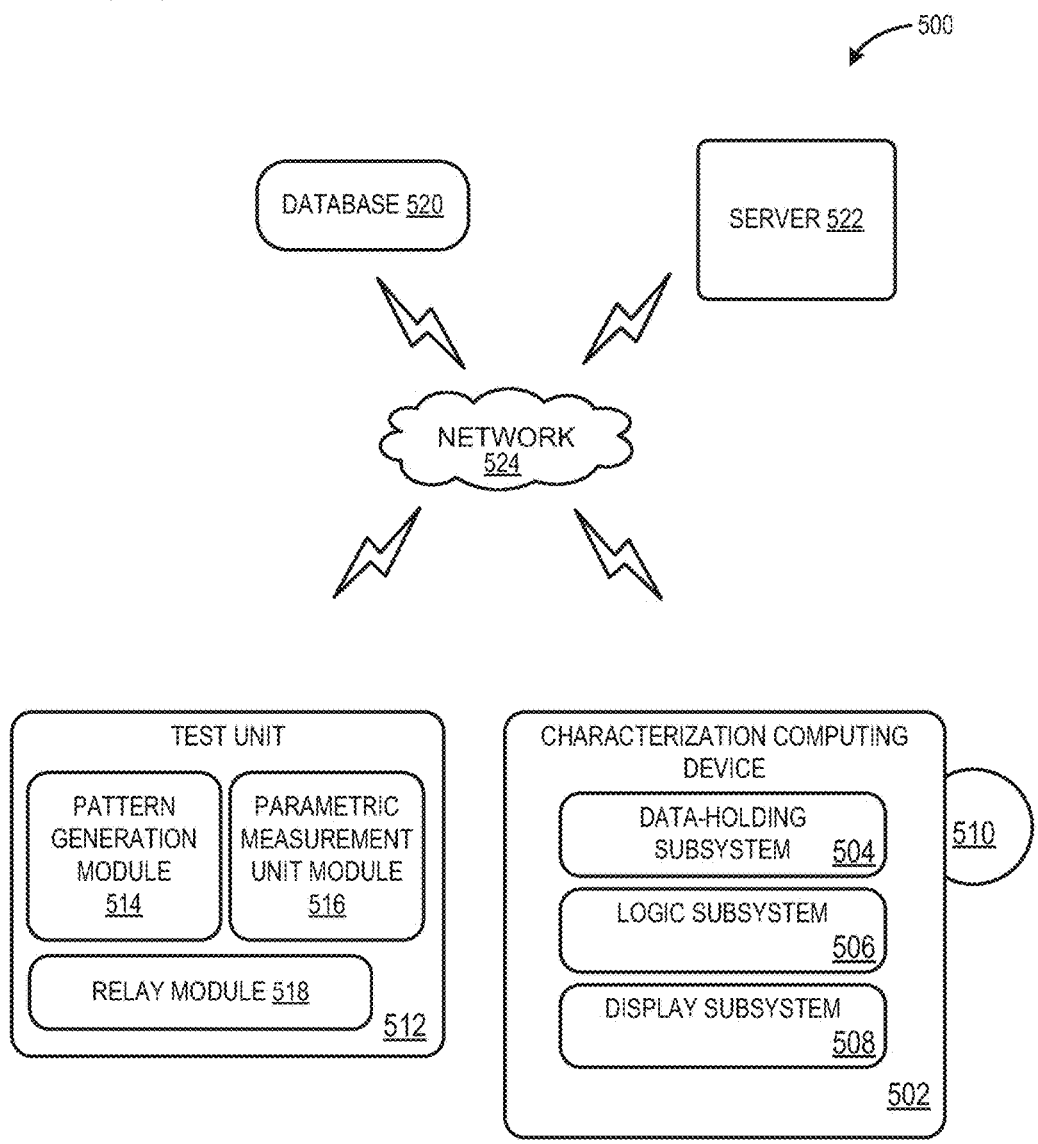
FIG. 5 schematically shows another example system for testing a semiconductor device according to an embodiment of the present disclosure.

FIG. 5 schematically shows an embodiment of a system 500 for testing a semiconductor device including characterization computing device 502 and test unit 512. Characterization computing device 502 includes a data-holding subsystem 504, a logic subsystem 506, and a display subsystem 508. Instructions held in data-holding subsystem 504 and executed by logic subsystem 506 may be used to perform various method described herein. Data-holding subsystem 504 may include one or more physical, non-transitory, devices configured to hold data and/or instructions excluding a signal per se that are executable by logic subsystem 506 to implement the methods and processes described herein. For example, data-holding subsystem 504 may include one or more hard disks, flash drives, memory devices, caches, and/or registers configured to hold data and/or instructions. A logic subsystem 506 may include one or more physical devices configured to execute one or more instructions stored in data-holding subsystem 504. For example, logic subsystem 506 may include one or more processors that are configured to execute software instructions.

Display subsystem 508 may be used to present the output described herein in a manner so that the output may be transformed into a visually cognizable form. Display subsystem 508 may include any suitable display device, which may be combined in a shared enclosure with data-holding subsystem 504 and logic subsystem 506 or which may be include one or more peripheral display devices.

FIG. 5 also shows removable computer-readable storage media 510, which may be used to store and/or transfer data and/or instructions executable to implement the methods and processes described herein. It will be appreciated that any suitable removable computer-readable storage media excluding a signal per se may be employed without departing from the scope of the present disclosure. Non-limiting examples include DVDs, CD-ROMs, floppy discs, and flash drives.

As shown in FIG. 5, test unit 512 includes a pattern generation module 514, a parametric measurement unit module 516, and a relay module 518. Pattern generation module 514 is configured to provide a test pattern to the semiconductor device. Thus, pattern generation module 514 may be used to provide a test pattern to the semiconductor device prior to adjusting an electrical state of a pin, to set logical states of the device, and so on.

Parametric measurement unit module 516 is configured to adjust the selected electrical state and measure the dependent electrical state of the pin. For example, parametric measurement unit module 516 may be used to select and adjust suitable voltage and current values and to detect and collect suitable current and voltage measurements in response.

Relay module 518 is configured to switchably electrically couple pattern generation module 514 or parametric measurement unit module 516 to the pin. Because a logical state may not be set for a pin concurrent with electrical characterization, in some embodiments, relay module 518 may be employed to switch the active electrical communication of the pin between pattern generation module 514 and parametric measurement unit module 516 upon selection of that pin for electrical characterization. Thus, that pin may be able to be selected and deselected for electrical characterization and pattern testing, respectively, without being physically disconnected from test unit 512. In some embodiments, a DUT may be coupled to the test unit via a fixture.

Further, as shown in FIG. 5, characterization computing device 502 and/or test unit 512 may be operatively connected to a server 522 and/or database 520 via a network 524. Database 520 may store one or more expected electrical characterizations used for comparative purposes as described herein. Database 520 may be any suitable database. For example, database 520 may be a remote database stored on server 522 in some embodiments, while in some other embodiments database 520 may be stored at characterization computing device 502 and/or test unit 512, for example. Further, in some embodiments, database 520 may be accessible via a cloud computing service, for example. It will be appreciated that database 520 may be stored on any suitable storage medium, and further, may be accessible via any suitable communicative pathway.

In this way, the semiconductor testing system described herein may generate an electrical characterization of one or more pins by adjusting an electrical state of a pin and measuring the corresponding dependent characteristic of that pin. By first providing the test pattern, a logical state of the pin prior to measuring an electrical characteristic may be known. In this way, the electrical characteristic of the pin may be predictable and the semiconductor device may be screened for faults.

(Electrical Over-Stress) EOS Failures and Remote Failure Analysis

In some applications, we seek to identify the cause of certain failures. For example, failures may occur in the IO peripheral circuitry, analog cores, or digital cores. In some cases, diagnosis may require acquiring curve trace data based on curve trace tests. For example, pass/fail decisions by be determined programmatically (or algorithmically) responsive to deviations in the curve data. In a preferred embodiment, deviation thresholds may be user-settable as further described below.

EOS events will typically cause either opens or shorts to occur on individual pins or a group of pins. In the case of opens, current will no longer be able to flow from the pin to its desired location. Typically a continuity measurement is sufficient to detect these failures because they cause failures in the bonding or the ESD protection diodes. There are occurrences when an EOS event will cause a partial open or degradation in the performance of the protection circuitry. These failures require a curve trace to identify the failure. Shorts can occur between a pin(s) and another pin(s), the pin(s) and ground, or the pin(s) and a power supply. Adequately detecting and characterizing these failures may require a pin-to-pin curve trace.

Figure 6:
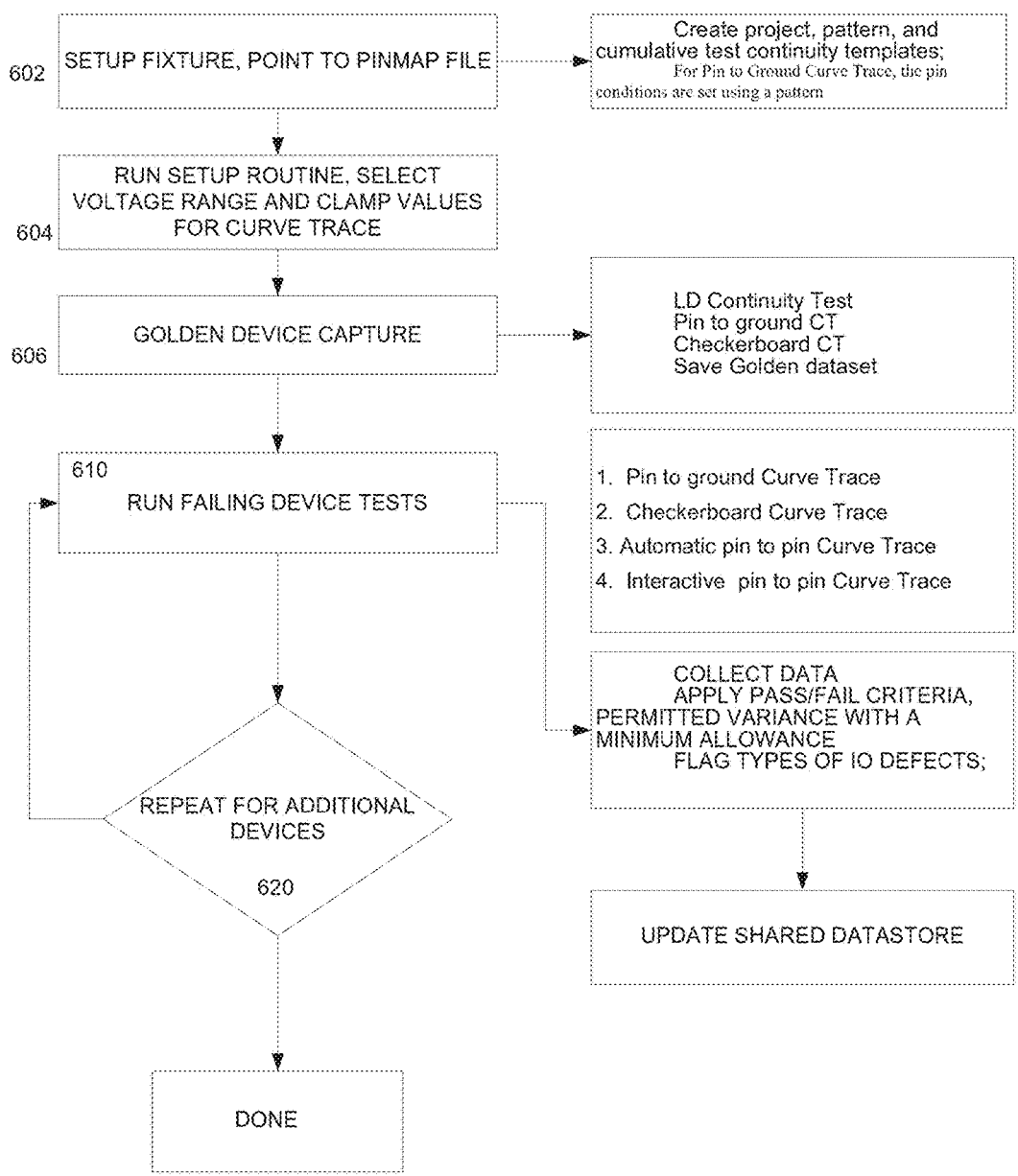
FIG. 6 is a simplified flow diagram illustrating one process for failure test and diagnosis.

Referring now to FIG. 6, a simplified flow diagram illustrates one process for failure test and diagnosis. Several of the individual tests are described in more detail above. In some cases, initially, a user will need to provide a pinmap file for their fixture/DUT combination. The fixture will need to route all required pins to data channels for all of the pins to be tested. This can be done with a level shifter board, but other fixture options may work as well. Preferably, the pinmap should contain power and ground signals and their appropriate mapping to the tester resources. Most devices will have multiple power and ground pins these since these will need to be driven to the same value, the user should have a pinmap with multiple signals of the same name mapped to their appropriate channels. Table 1 shows an example.

TABLE 1

| Example Pinmap |
|---|
| GND, JA1-1A |
| GND, JA1-2A |
| VDD, JA1-2B |
| VDD, JA2-3C |
| VDDIO, JB1-2F |

When the pattern is created for this pinmap GND will have one signal in the pattern, but it will be applied to multiple pins. This will ensure that conflicting values are not applied to DUT resources that are intentionally shorted together on the chip. Referring again to FIG. 6, following fixture setup and establishing a pinmap file, or a pointer to a pinmap file, block 602, the process proceeds to run a setup routine, block 604.

When the setup routine is executed, the system may create a project, pattern, and the correct curve trace (CT) and continuity templates. A preferred set of tests may include the following:

1. Pin to Ground Curve Trace ("CT")
2. Checkerboard CT (0x5, 0xA, 0x3, 0xC)
3. Automatic Pin to pin CT (one pin 0, all others X)
4. Interactive Pin to pin CT The user should be able to select the voltage range and clamps for the CT. A default range may be, for example, +/−1.4V for the force range and +/−5 mA for the clamps. These are illustrated below.

In order for the system to determine pass or fail criteria, a golden device must be tested, block 606. This may be done in advance, and the characterization(s) of the golden device stored in a datastore, for example, a shared database 520. A golden device is one that is known to be defect free. The results of the golden device will be saved and failing device data will be compared against this data set. The golden device data collection may run, for example, the LD (Lower Diode) continuity test, the Pin-to-Ground curve trace test, and the Checkerboard curve trace. Regarding the Lower Diode continuity test, this is to ensure proper connection between the tester channels and the I/O of the device under test, utilizing continuity testing. This step also ensures that there is no break with the bond wires of the device under test. Software to control and execute these and other tests may be stored in a datastore 504 described above.

Next, at block 610, the system begins to run tests on a device coupled to a test unit using a suitable fixture. A user can simply insert the device and click a "run button" (physical or virtual, such as screen icon). Preferably, the system may calculate an estimated time for the test to run, for example, based on 4 s per pin in the pattern. This estimate is based on observed speeds of 500 ms per pin to run a curve trace multiplied by the 5 tests that run all of the pins and some overhead for calculating the failures. These values are merely illustrative estimates, and may be adjusted empirically. The pin to pin CT routine is not included in the calculation because is should only need to be run on a small number of pins. In a preferred embodiment, a user should be able to run the full pin-to-pin test for all pins. For this, the time estimate may be based on the square of the number of pins times 500 ms. A user should be able to cancel a run after it has started.

In a presently preferred embodiment, a default run should run the continuity test followed by the pin to ground and checkerboard CT tests for all signals. The values acquired from these tests should be stored and compared with the golden data to determine whether the pin passed or failed. The user should be able to set the allowable variance, but a default should be present. These features are not critical but they help to keep the user interface as simple and "user friendly" as possible. Any signals that are determined to have failed (see pass/fail criteria below) should be run through the pin-to-pin CT (curve trace) routine further described below.

Pass/Fail Criteria

The pass or fail criteria must effectively flag pins with the types of IO defects that may be encountered. The threshold values may be determined based on the golden data, but they will have an allowable variance from the golden device. There may be a default variance value that the user can re-set if they wish to tighten or loosen the pass or fail criteria. The threshold preferably is set with two parameters: an allowable variance percentage, and a minimum value for that variance.

Figure 7:
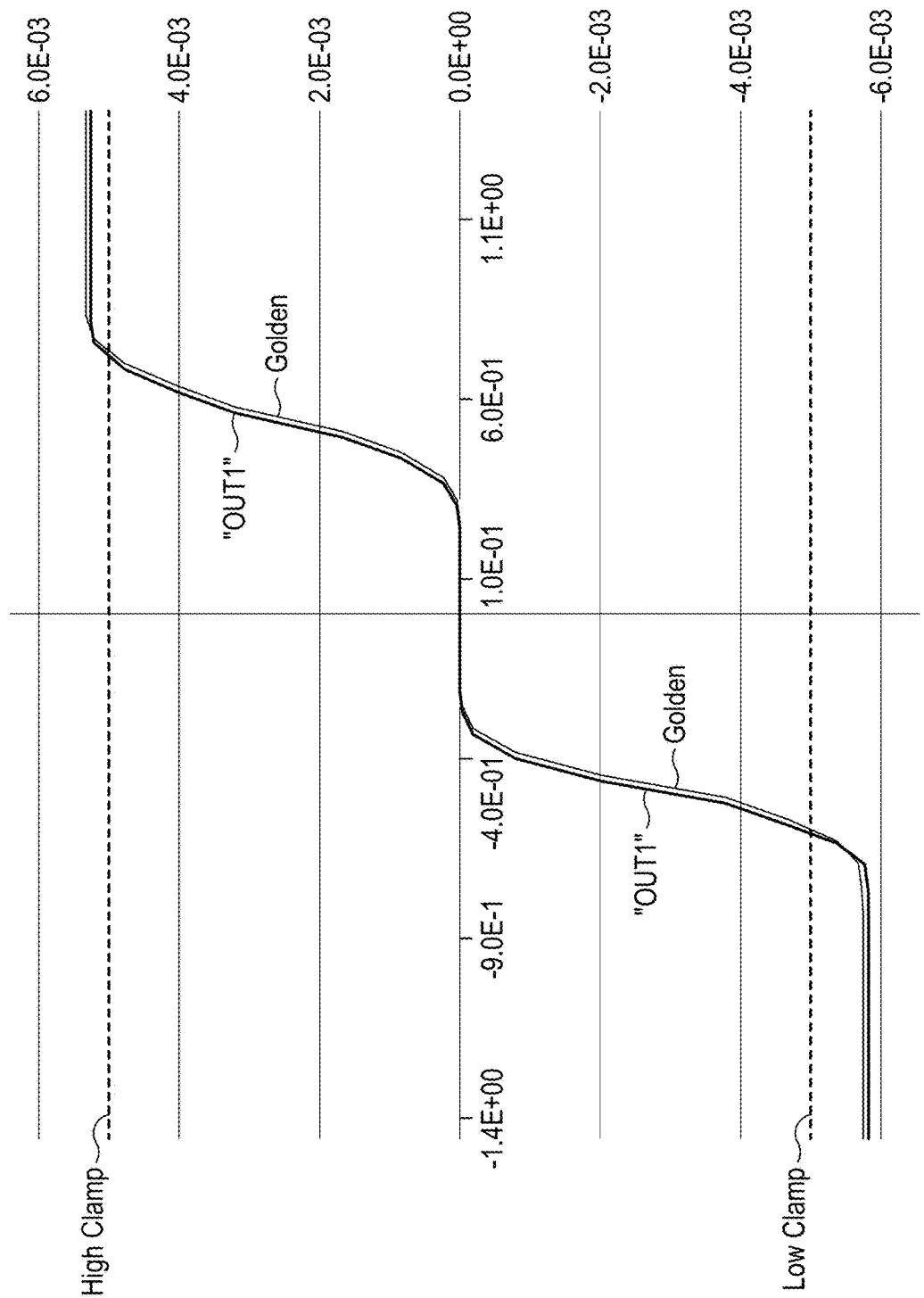
FIG. 7 is a voltage-current curve trace illustrating high and low clamp settings.

Referring now to FIG. 7 it shows an example curve trace for signal OUT1 current as a function of voltage for a DUT. The corresponding golden device values also are plotted here; see trace labeled "Golden." In this type of test, as the curve passes through the voltage range near 0V, there will be very little current. On a test run on one pin of the DDM2 board, for example, we measured about 6 nA of current when we forced 0V during the curve trace test. As the voltage increases in either the positive or negative direction, the ESD protection diodes will forward bias and allow current to flow through them until they reach the high and low clamp settings, shown as dashed lines in the drawing; here around +/−5 mA. These settings may be determined by a Parametric Measurement Unit (PMU) (516 in FIG. 5).

A simple percentage variation can be used effectively in the regions where the ESD diodes are forward biased, but would be far too tight when they aren't. In this example, if we use a 10% allowance at 0V, we would only have +/−600 pA of tolerance. If we increase this percentage to something useful in this range, we will lose our effectiveness during the portions of the test where the diodes are turned on. We have found that using an allowable variance in combination with a minimum allowance allows the tool to effectively screen defective units, but pass those without defects. In a presently preferred embodiment, the defaults may be a 10% variance with a minimum allowance of 2 uA.

Figure 8:
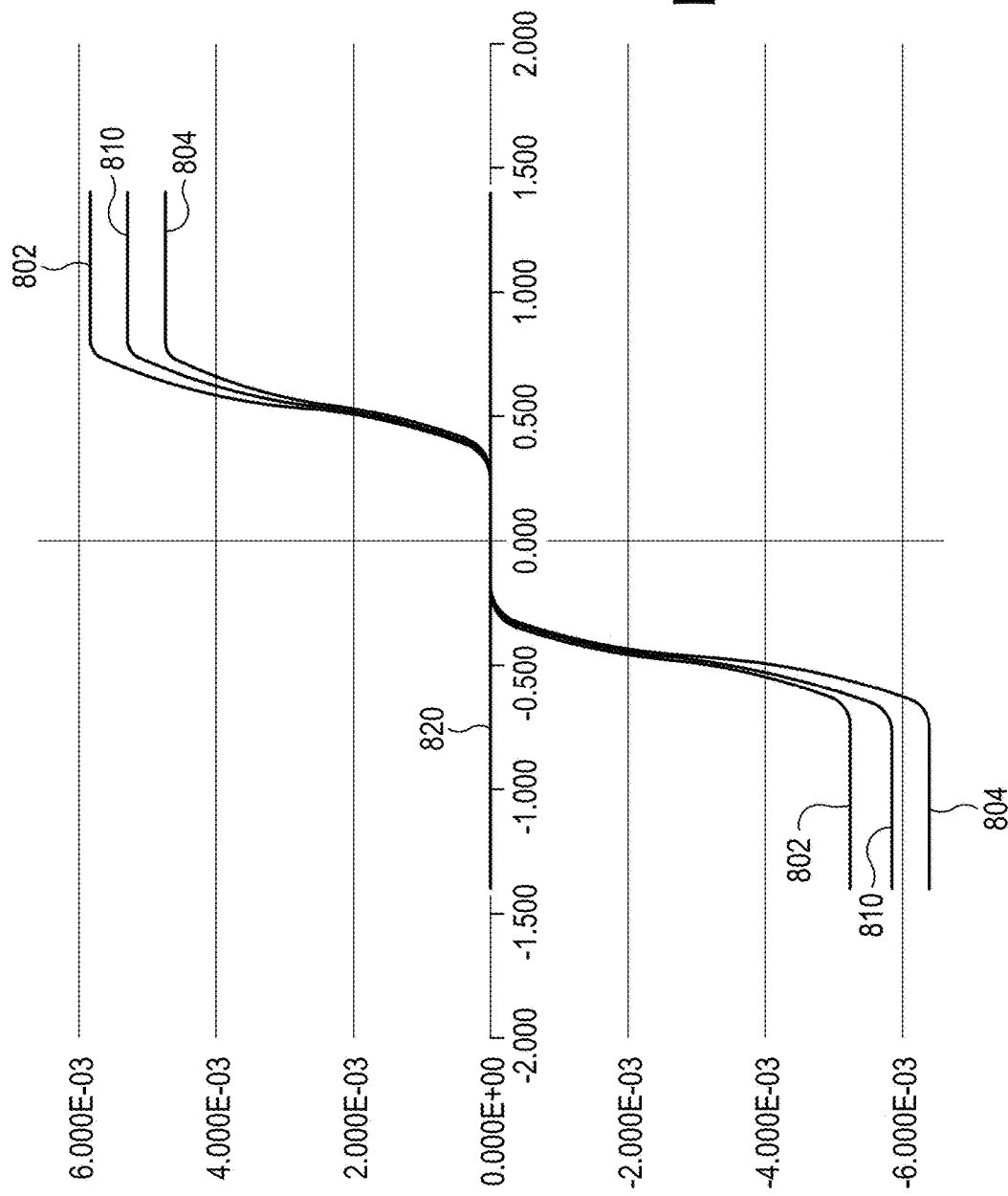
FIG. 8 shows a curve trace illustrating pass/fail thresholds relative to golden data.

Referring now to FIG. 8, another curve trace display shows the golden data trace 810 and the upper and lower variance limits, traces 802 and 804, respectively; indicating the pass/fail thresholds based on the above defaults. Anything between these lines is considered a pass. The line 810 illustrates the golden data from which the thresholds are calculated. The line 820 along the x-axis illustrates the test data in the presence of a defect. In the case of an open pin, we will not measure any current no matter what voltage we apply. This defect will be detected when the diodes do not become forward biased and the test curve exits the fail boundary as illustrated in the drawing, trace 820.

Referring now to FIG. 9A, again a golden data trace is shown, along with associated upper and lower limits as discussed. In all these examples, the underlying test data may be stored in a datastore, and accessed by a remote user, such as a failure analysis engineer or system at a remote location. These plots optionally may be displayed at the location where the tests are conducted. In FIG. 9A, a hard short defect will allow all of the available current to flow through the IO regardless of the voltage applied; see trace 902.

Figure 9B:
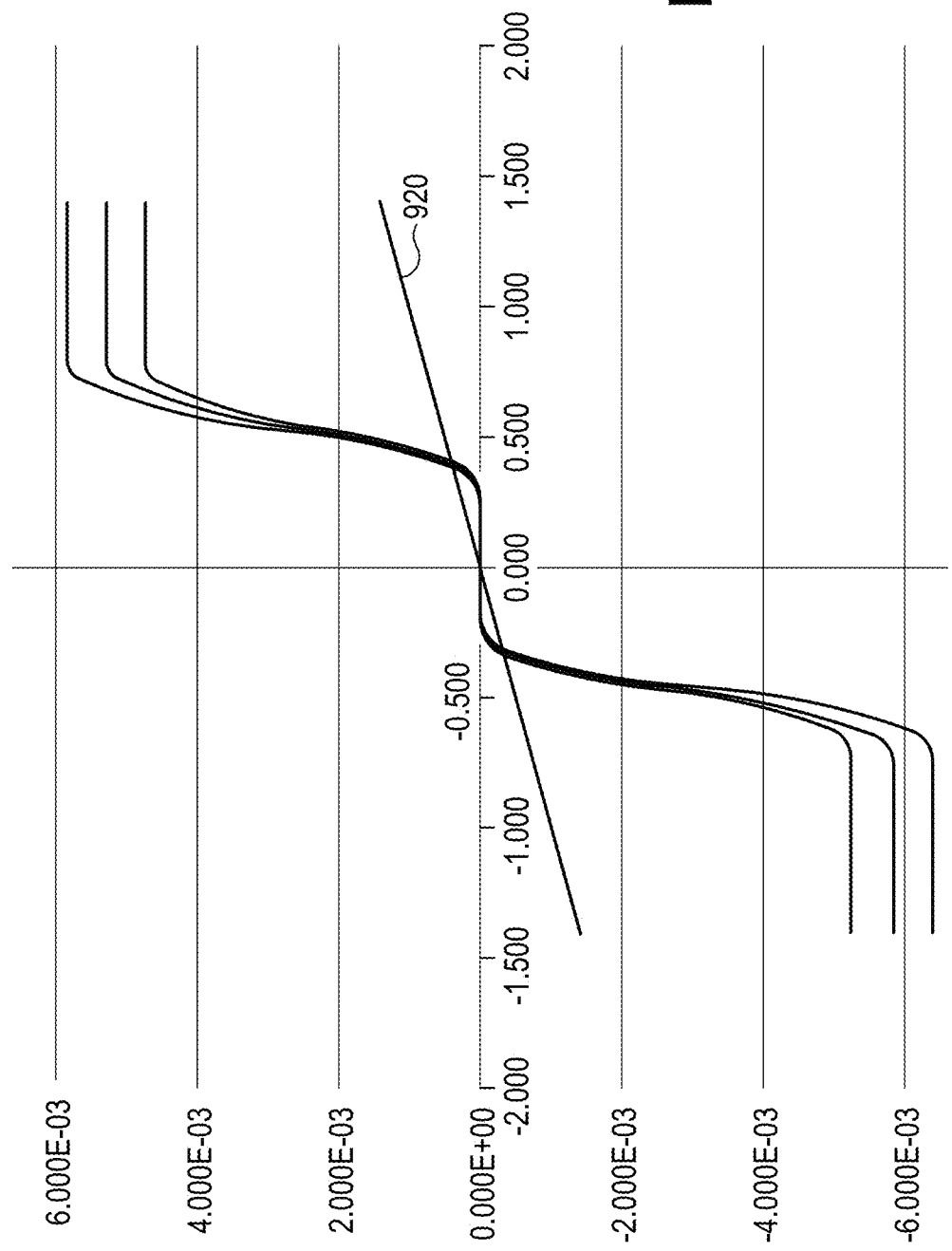
FIG. 9B is a voltage-current curve trace illustrating a one k-ohm defect.
Figure 9C:
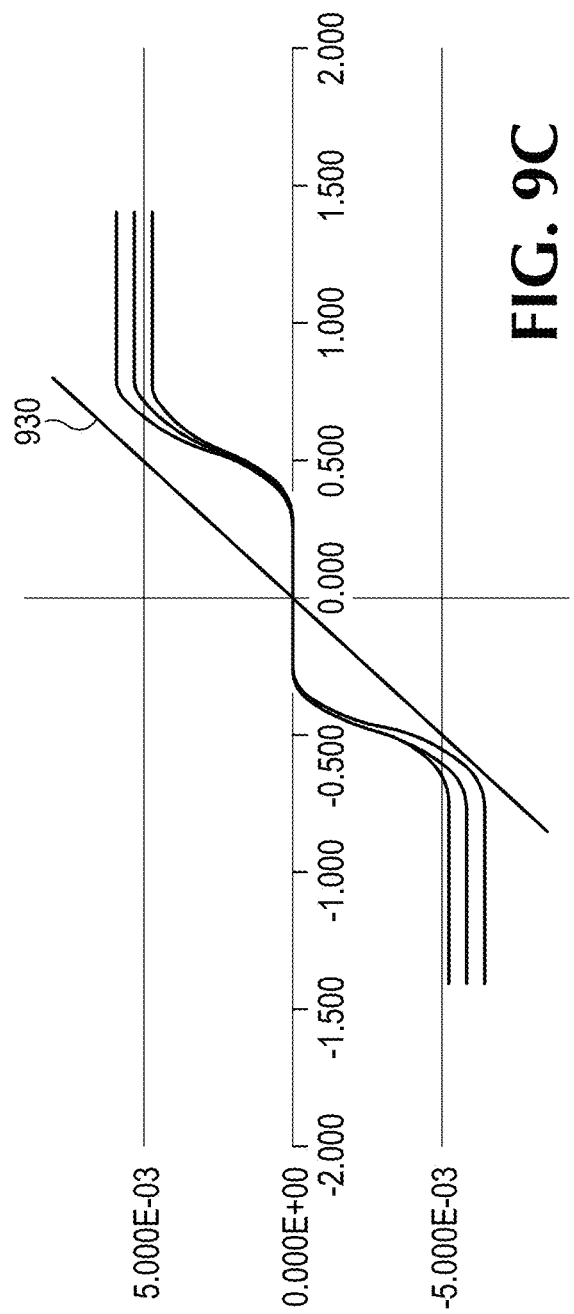
FIG. 9C is a voltage-current curve trace illustrating a 100 ohm defect.

Referring next to FIG. 9B, in the case of a pure resistive bridge, the curve will be linear with respect to voltage and will exceed the pass or fail criteria at some point along the curve. FIG. 9B illustrates a curve trace showing a 1 k-ohm defect. In other words, the test reveals a purely resistive bridge having an effective resistance of 1 k-ohm, as indicated by the slope of line 920. Referring now to FIG. 9C, it illustrates a curve trace 930 showing a 100 ohm defect.

Figure 9D:
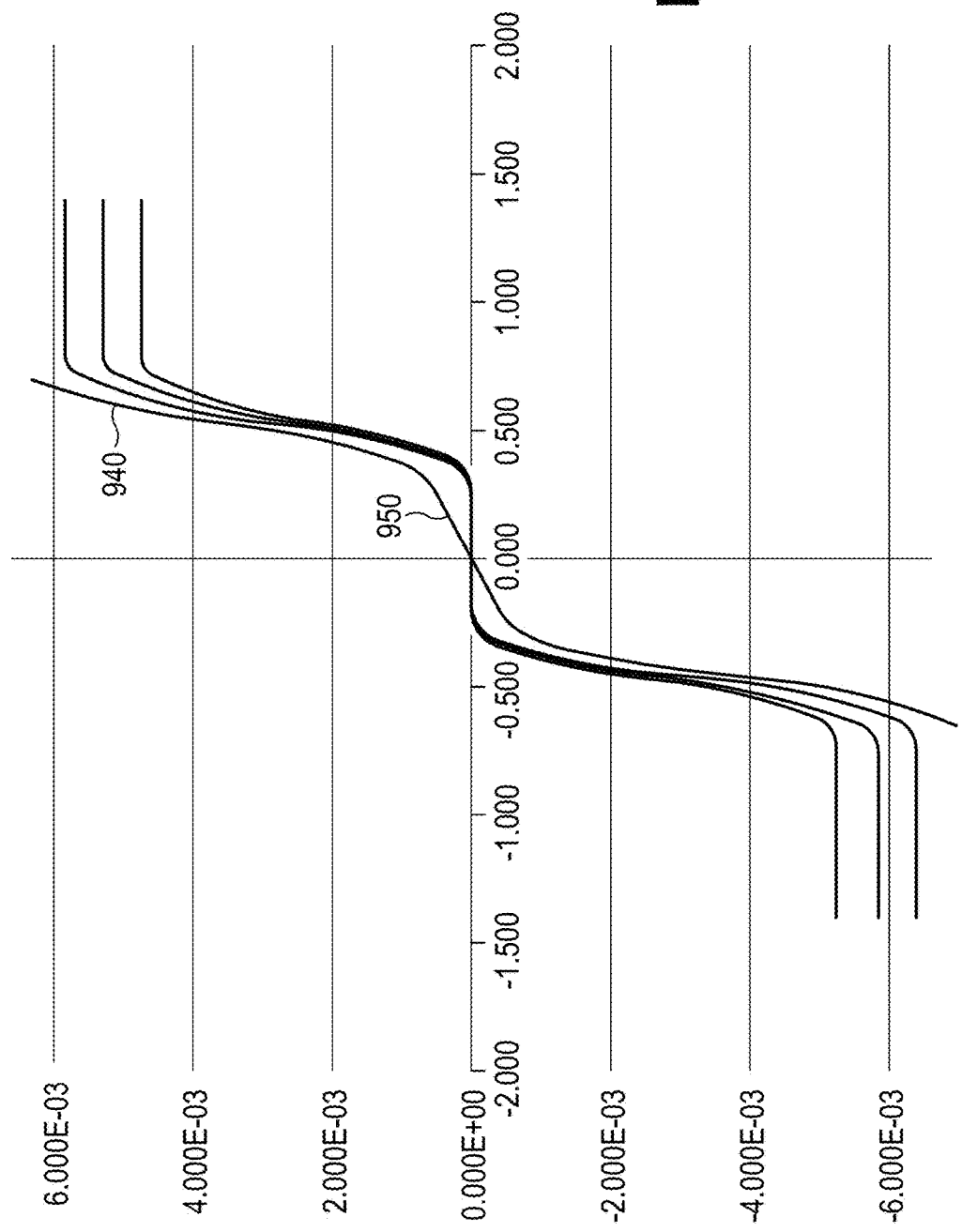
FIG. 9D is a voltage-current curve trace illustrating a 500 ohm defect with good diode.

A very difficult defect to detect is a resistive bridge with a good diode. Here, the parallel paths of the defect and the diode cause the measured current to be the sum of both the defect and the diode. At lower resistances, the defect will dominate the shape of the curve as current increases and will be relatively easy to detect. Referring now to FIG. 9D, it illustrates a curve trace showing a 500 ohm defect with a good diode. The curve trace 940 shows the result. The resistance is reflected in the slope in the central region 950 of the curve.

Figure 9E:
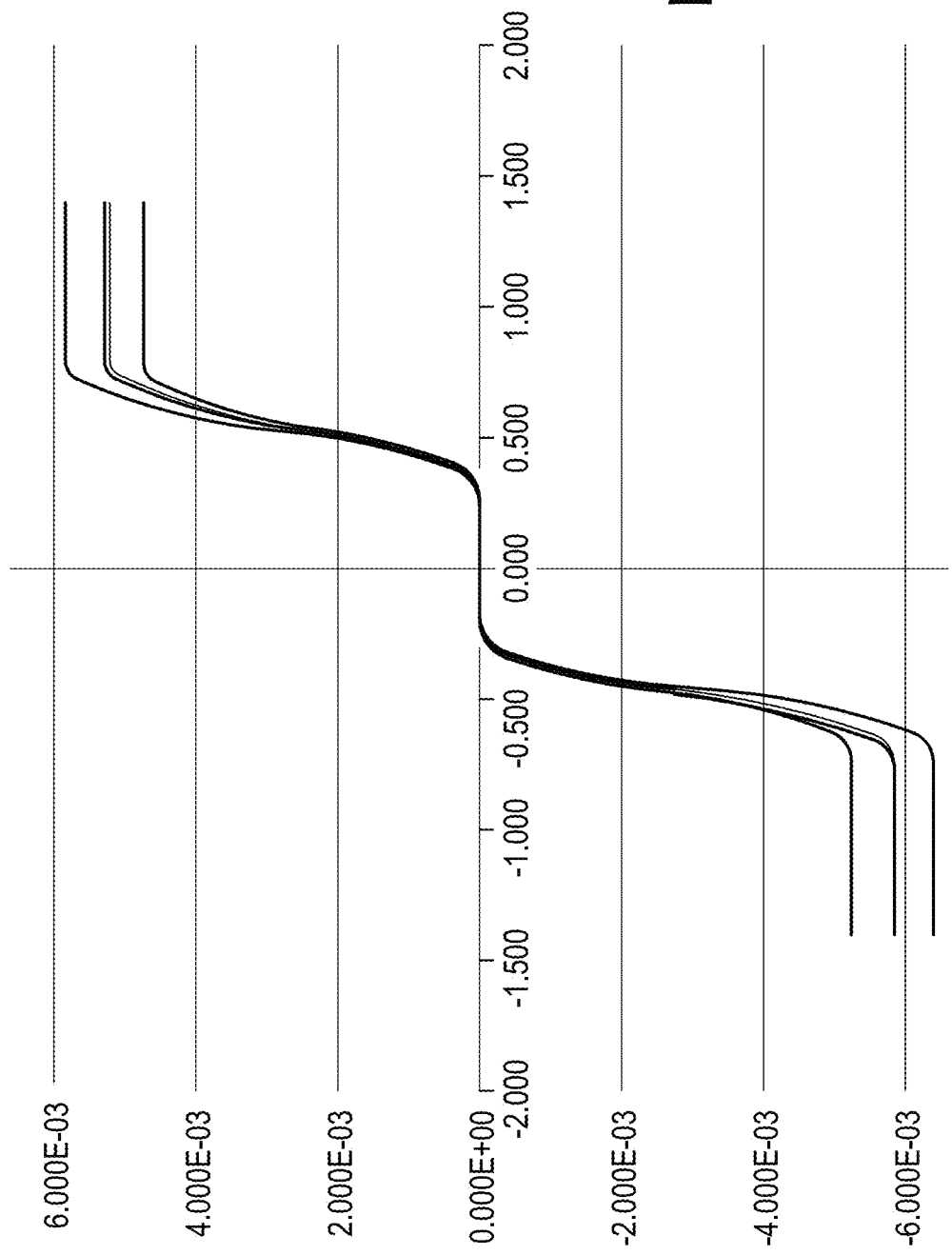
FIG. 9E is a voltage-current curve trace illustrating another defect.

Referring now to FIG. 9E, as the resistance of the defect increases, the diode will dominate the curve. Only when the diodes are turned off will the effect of the defect be observable. With the default minimum allowance of 2 uA, the system will be able to detect such a defect up to about 50 k Ohm. In this plot, the curve falls outside the test limits in the middle portion of the curve, but it is difficult to discern. This highlights the need to zoom into this area as will be described later.

Tests and Results

In an embodiment, the user can access screen displays to see the pin to ground curves and the pin to pin curves for the failing signals. They should also be able to optionally view the pin to ground results for the passing pins. The pin to ground results preferably may display the curve with the golden data overlaid in a contrasting color.

For the pin to pin test each signal is used as a reference when that signal is set to '0' and all others are set to 'X'. The pins with the 'X' are connected to the PMU for the CT test. These curves should be overlaid in different colors in a manner to which the user can determine which pin deviates from the norm. Preferably, the user would be able to select a signal from the list and see the curves from that signal highlighted on the curves. In a preferred embodiment, each reference pin should have a curve plot with the results of the test pins overlaid on it.

On the other hand, various test data may be stored in a datastore for remote analysis (review, display, etc.), for example, by a manufacturer's FA engineer or system. Local display where the tests are conducted (where the suspect device is located) is helpful but not essential. The "local user" may select and run various tests as requested by a remote FA resource using a telephone, email or other method of communications to interact with a local site. In this way, questions can be resolved and decision made without physically shipping suspect devices back to the distributor or manufacturer.

For the pin to pin test, each signal is used as a reference when that signal is set to '0' and all others are set to 'X'. The pins with the 'X' are connected to the PMU for the CT test.

These curves should be overlaid in different colors in a manner to which the user can determine which pin deviates from the norm. In one preferred embodiment, the user can select a signal from the list and see the curves from that signal highlighted on the curves. Each reference pin may have a curve plot with the results of the test pins overlaid on it.

General Pattern Requirements

For Pin to Ground Curve Trace, the pin conditions preferably are set using a pattern. To perform a pin to ground test, all pins must be tied to ground except for the test pin. Typically, checkerboard tests are only used to quickly identify pins that require a pin to pin curve trace. Thus they reduce the amount of time required to acquire the pin to pin data needed. The premise for this is that if there is an unwanted connection between pins, then the curve will be affected by the value on the neighboring pin. In other words, a pin that is isolated properly should have the same curve if the adjacent pin is a 0 or if it is a 1. If this is not the case, there is probably some EOS damage. Since we do not have, or want, pin location information the checkerboard approach is used to increase the probability of testing with neighboring pins in opposite states. Given the list of signals, it is preferable to create a series of vectors that provide the alternating values to the pins. Below are 4 patterns that may be used in some tests. Other patterns and variations may be needed for adjacency in different packages.
1. 0xA=1010 1010 1010, etc.
2. 0x5=0101 0101 0101, etc.
3. 0xC=1100 1100 1100, etc.
4. 0x3=0011 0011 0011, etc.

For pin-to-pin curve trace, One pin at a time is set to ground by putting a 0 on that pin. All other pins are set to X, which causes a high-impedance condition on the remaining pins. As noted above, the assessment of passing or failing devices depends in some cases on collection of golden data to which the test curves can be compared. Most of the pins on a given design will be fully isolated from the others. On these pins, there should be no difference in curves between the pin to ground, checkerboard, and pin to pin results on the golden device. For these pins, the pin to ground results can be used as the golden data for all types of curves.

Illustrative User Interface

A graphical user interface, with "radio buttons," "pull-down" menus and the like may be implemented in test software to conveniently . . . .
Create Field Test Project Flow
In one embodiment, a testing project may proceed generally as follows.
1. Setup hardware and launch program.
2. Select or create a new project
3. Launch program, for example, by radio button
4. Select a pinmap file; or create or edit a pinmap as needed
5. User clicks the "build project" button.
 a. System reads the pinmap and creates the following tests for the pins in the pinmap file.
  i. Pin to ground Curve Trace
  ii. Checkerboard Curve trace
  iii. Automatic Pin to Pin Curve Trace
  iv. Interactive Pin to Pin Curve Trace
 b. Software creates a test program that will run the pin to ground, checkerboard, and automatic pin to pin tests.
  i. No power supplies are enabled
  ii. Pin voltage for all pins is set to 1.4V. (This is the same as the curve trace voltage range and should be safe on the IO's. The users should be able to change this within the project.)
6. User connects to tester, places a part in the socket, and then clicks "Collect Golden Data" button.
 a. checks that the PMO is calibrated. If not, then it runs the PMO calibration.
 b. Software runs the Pin to ground and checkerboard tests and saves the results as golden data.
 c. Software compares the checkerboard data with the pin to ground data and identifies pins that show a difference between these traces.
 d. Software runs the pin to pin curve trace on all pins that showed a variance between the pin to ground and the checkerboard results and saves this as pin to pin golden data. For all other pins, the pin to ground golden data results will be used.
 e. The Pin to Ground results are displayed to the user.

At this point, the user can either save the project to send to the field or continue to run devices. In other words, the user may be creating the project for use at a field site. For example, the user-creator may be a FA engineer working at or for a manufacturer.

Example Program Flow

Figure 10:
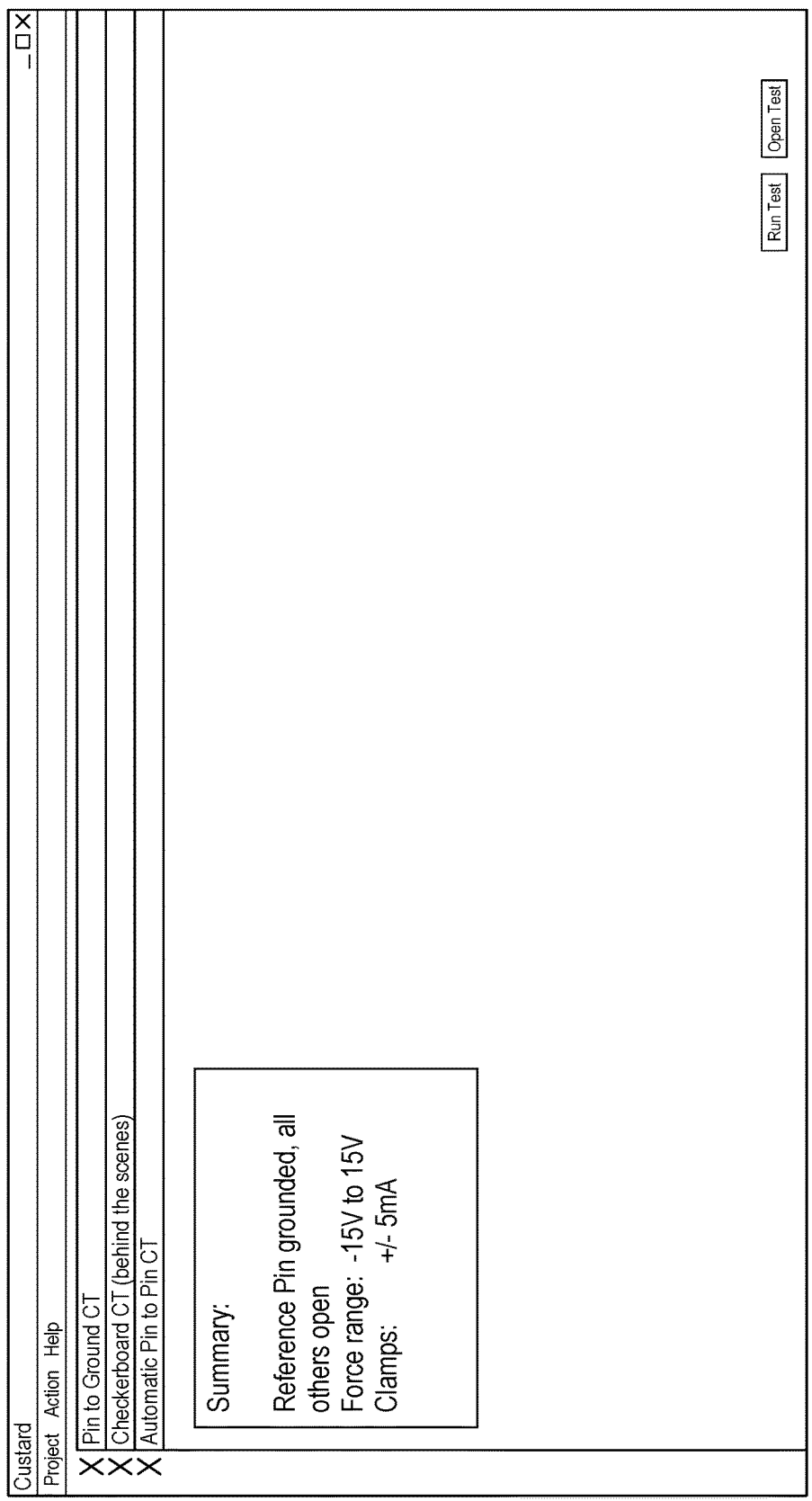
FIG. 10 illustrates an example of a screen display user interface Test Program View.
Figure 11:
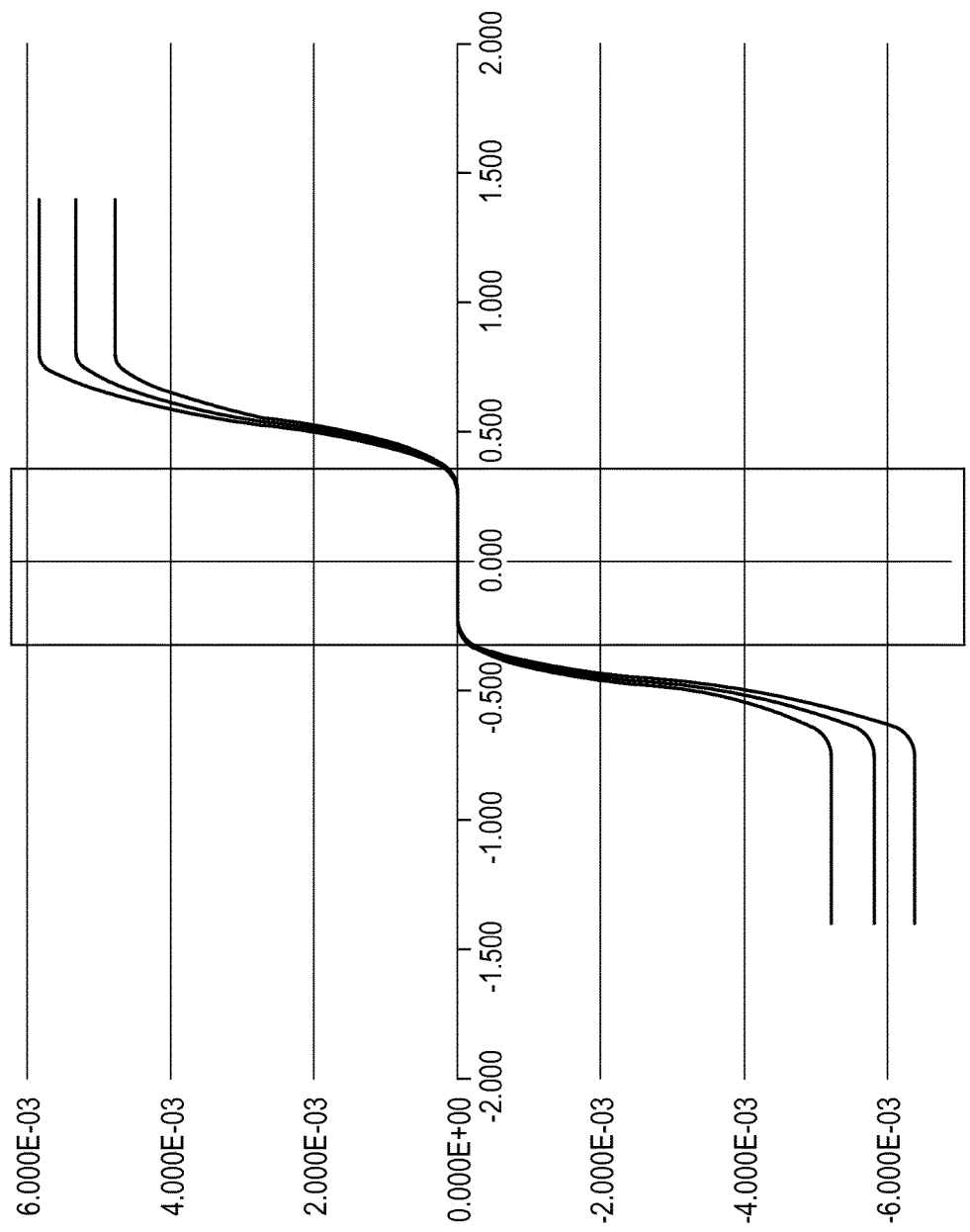
FIG. 11 illustrates a vertical overlay highlighting a failing portion of a test pin curve.

In one embodiment, when a user opens the project (Project->Open) they may be on the test program view as shown in FIG. 10. An illustrative process continues as follows.
1. User clicks the "Run Program" Button
 a. They are prompted for a device label.
 2. If PMO is not calibrated, the calibration routine is executed.
 3. System runs the pin to ground and checkerboard tests. Any pins whose curves exceed the allowable variance from the Golden Data are flagged as failing.
4. System runs the automatic pin to pin CT test on the set of failing pins from step 3.
 a. For each pin in the set, the program sets the pin to 0 by pattern control and all other pins to X.
  i. The pin set to 0 is the reference pin and the others are the test pins.
 b. Each of the test pins is curve traced.
 c. The next pin in the set is set as the reference pin and the test pins are curve traced; repeating the process until the end of the set of failing pins.
5. The results of the Automatic Pin to Pin CT test are presented to the user as shown in the CT Test View—described below with regard to FIG. 12.
 a. A CT plot is generated for each reference pin.
 b. The curve from each test pin is overlaid on the plot.
 c. The golden data is overlaid on the plot.
 d. The failing portion of the curve area should be highlighted with a vertical overlay. FIG. 11 illustrates a vertical overlay highlighting a failing portion of a test pin curve.

Figure 12:
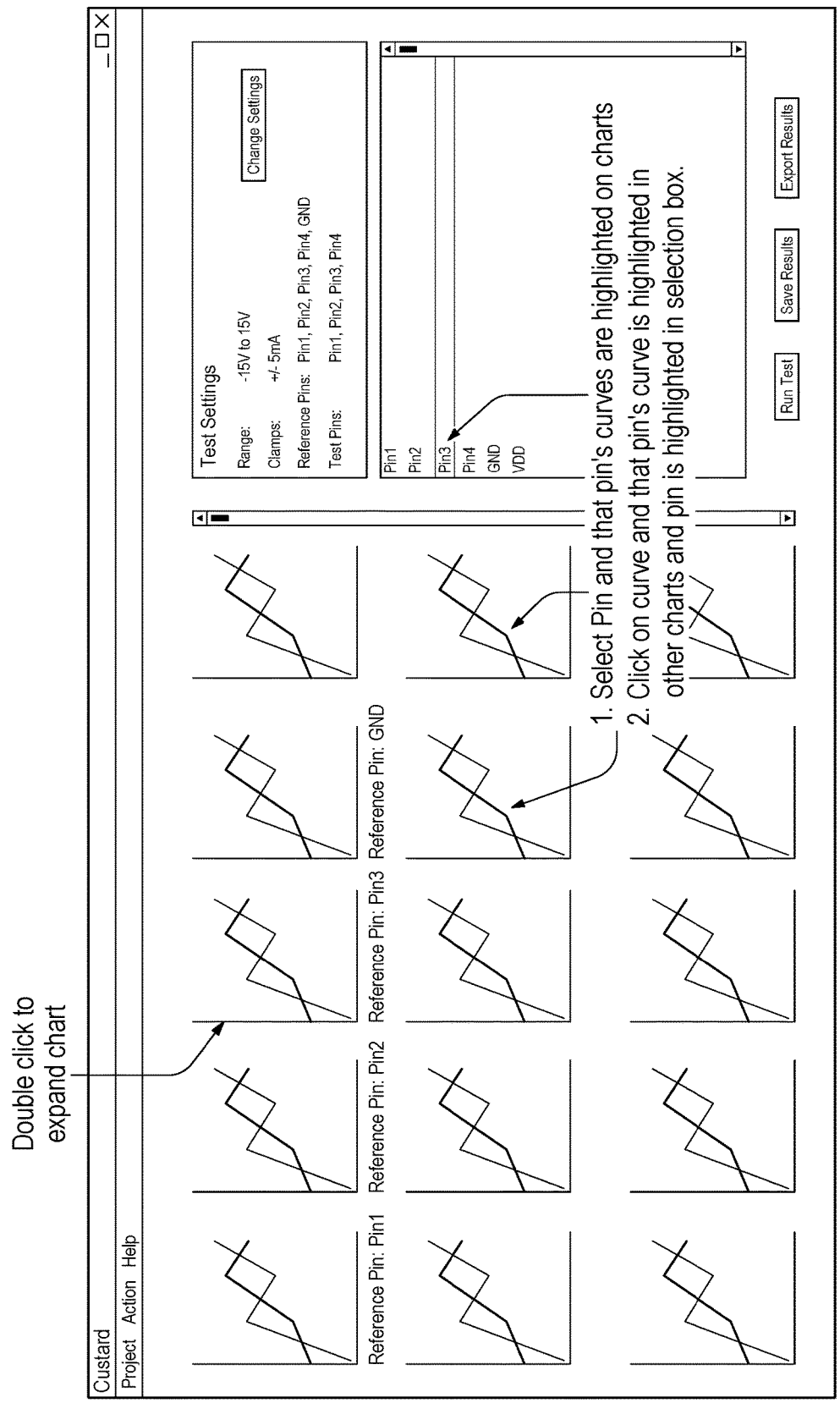
FIG. 12 is an example of an interactive user interface curve trace (CT) test view.

As noted, FIG. 12 shows an example of an interactive user interface display, referred to as the CT Test View. The specific layout of the display is not critical, but the interactive features illustrated are important. The interface display may include a list of test pins which are those flagged as failing pins. Utilizing an interface of the type illustrated in FIG. 12, a user can interact with the test system as follows.

6. The user can then click on a pin from the list and the corresponding curves are highlighted on each of the curves. This action is shown by arrows in the figure, from the pin list (Pin3 is selected) to the corresponding pin curves.

7. The user can also click on a curve and that pin's curve on all plots will be highlighted. The pin in the list will also be highlighted. Highlighting a curve may be done, for example, by line type, line thickness, color, or a combination of visual features.

8. The user can click the Run test button to re-run this test.
   a. Once the test re-run is completed, the user can click the save results button to keep the re-run data. They will be prompted for a device label.
   b. The user can click on previous runs in the results area and see those results.
   c. The user can click the Export results button to save the curve information in a datastore further described below. The display may also include test settings, for example, voltage range and clamp values, reference pins, etc. And it may include a list of devices, showing test dates, time, and failure count (pins), as illustrated in the drawing.

The interactive user interface display may further enable the following actions.

Figure 13:
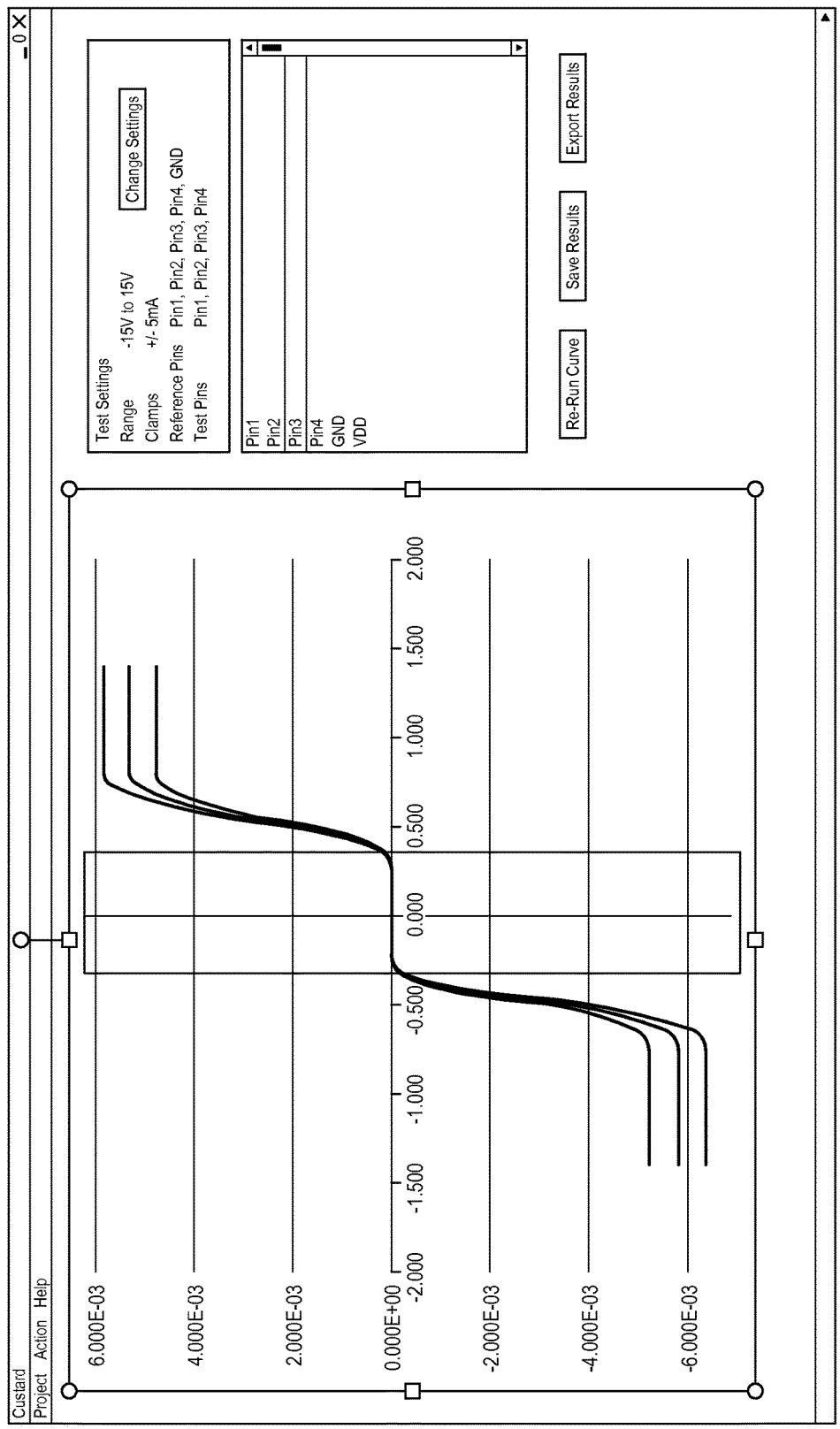
FIG. 13 is an example of an expanded curve trace plot.

9. The user may then double-click on the plots to expand the plot of interest as shown in FIG. 13. The display in FIG. 13 identifies the pin in the pin list, and expands the corresponding plot, here showing the upper and lower pass/fail curves, pin measured values, etc. The area to zoom in is user selectable. Preferable, the amount of zoom also is selectable.

10. In this view, the user can zoom in on a particular part of the curve. (This will be helpful to view the results of a failure with a higher resistive bridge fault in parallel with a good ESD diode.)

11. In this view the user can select turn on or off the display of a pin on the plot by selecting the check-box next to the signal.
   a. The Pass/Fail limit curves and the golden data curve will be available for display.
   b. All signals in the plot including the pass/fail curves and golden data will be displayed by default and the user can turn them off as they choose.

12. The user can then re-run the curve. This will run the curve in high-resolution mode. The results of the re-run can be saved or exported.

Interactive Pin to Pin CT Flow

Figure 14:
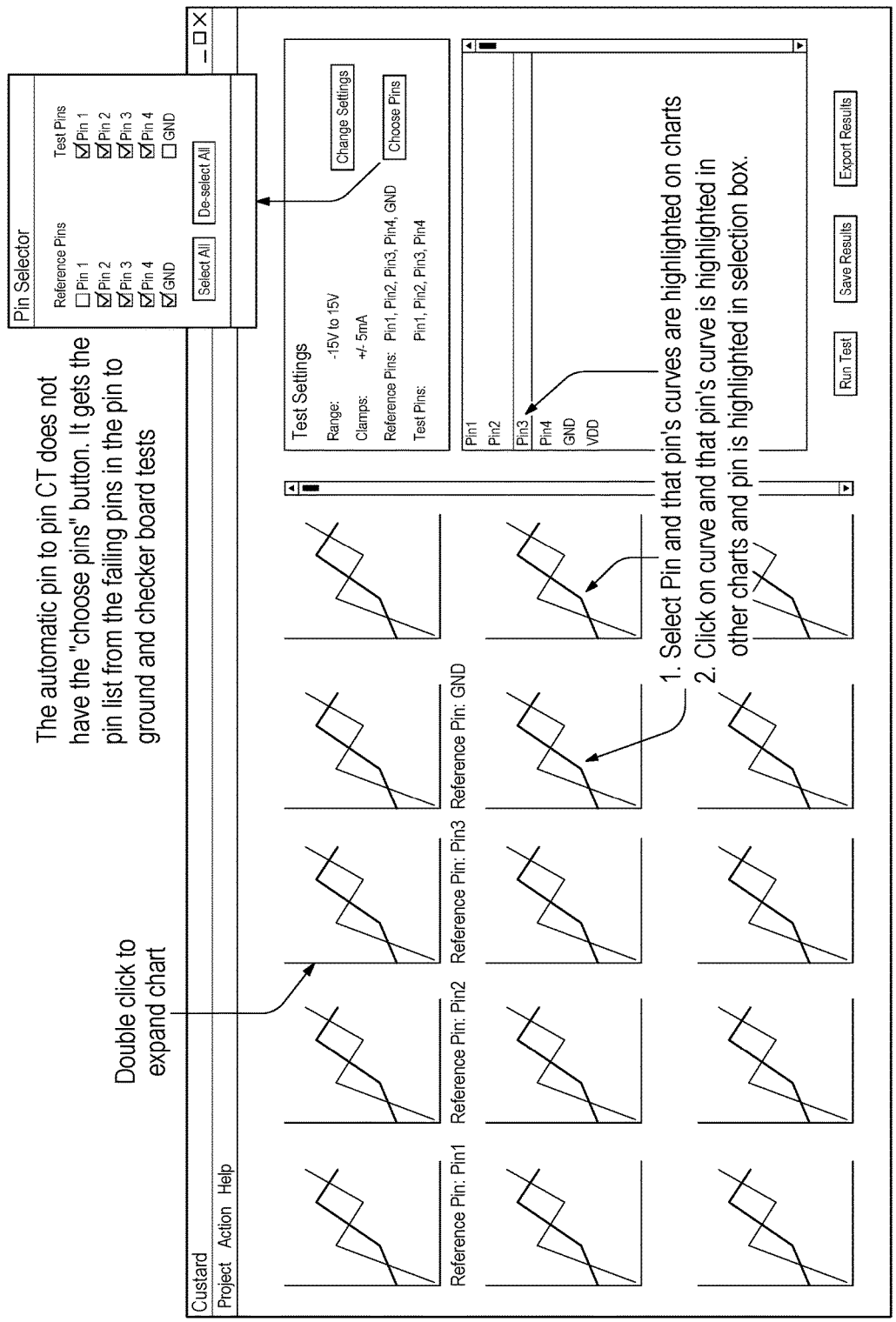
FIG. 14 illustrates an interactive user interface for pin to pin CT tests.

In an embodiment, a user can open an Interactive Pin to Pin CT test. This will bring up a pin to pin CT test that allows the user to select which pins to run instead of getting the set of pins from the pin to ground and checkerboard tests. This may be used both in the lab and in the field when the customer tells the user what pins they are having troubles with. This feature may be implemented, for example, as follows, referring now to FIG. 14, which illustrates an interactive user interface for pin to pin CT tests.

1. The user clicks the Select Pins button and a dialog is displayed.

2. The user clicks the check boxes to select reference pins and test pins.
   a. Select all and deselect all buttons are available to expedite large selections.
   b. User clicks done and the selected pins are displayed in the test settings panel.

3. User clicks Run test and the pin to pin routine is performed on the pins that they have selected.

4. Results are presented like the automatic version; for example, as in the CT Test View of FIG. 12. The user interface display preferably includes test settings, options to change settings, options for choosing pins etc.

Shared Database Interactions

As noted above, delays and expenses associated with parts that have failed, or are suspected of failure, can be considerable, especially where the suspect parts have to be shipped back to the manufacturer or other source for testing and analysis. End customers of newly built systems want to verify that all the components are of a consistent quality and that they were not damaged during shipment or assembly. However, shipping parts back under RMA is costly and inefficient. Using features of the present disclosure, appropriate testing can be conducted at remote sites, for example, at customer sites. Suspect devices may in some cases be found fully functional and compliant with applicable specifications. They need not be returned. In other cases, parts may be proven defective, and replacements can be shipped immediately.

Figure 15:
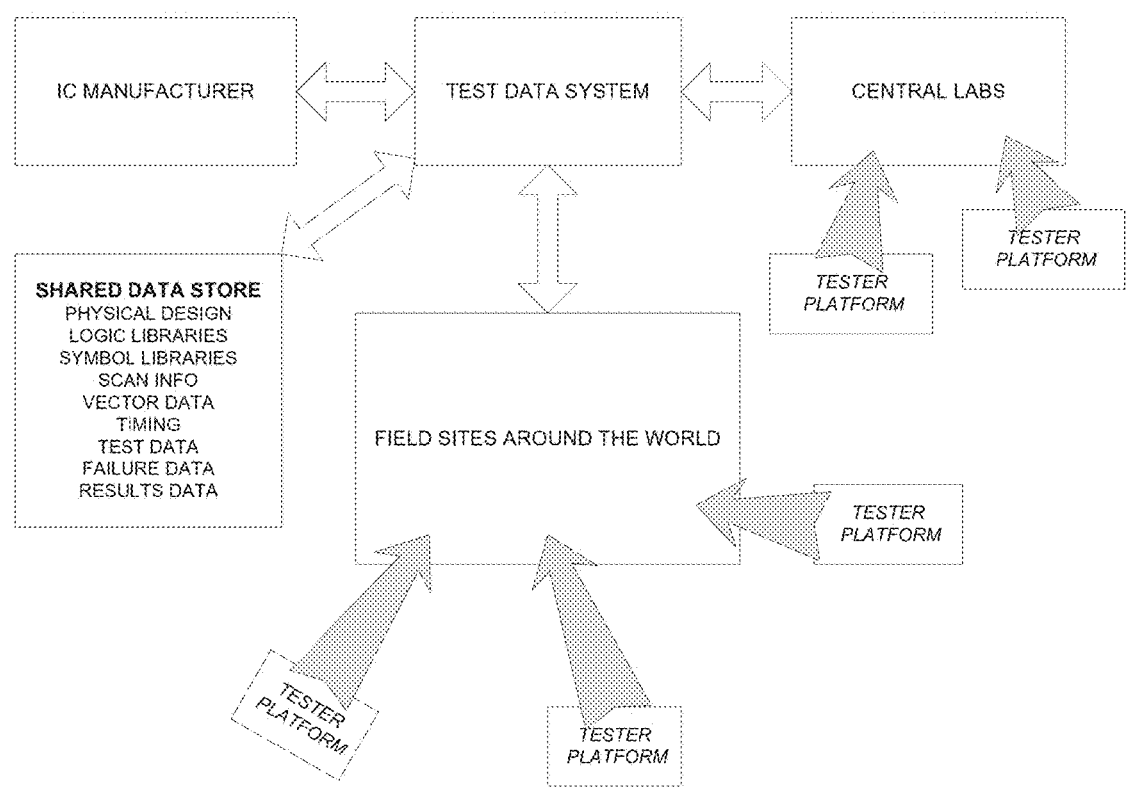
FIG. 15 is a simplified system diagram of a distributed test system.

To enable these advantages, we connect stakeholders into a world-wide network, in which IC failure analysis and testing become distributed rather than local. FIG. 15 illustrates such a system. Measurement data curves, among other things, are saved electronically, eliminating manual data recording errors, for documentation and later recall for further analysis. The stored test data can be accessed from a common database by designers, process engineers, FA people, as well as customer application engineers as needed. In an example, factory FA people can review test results (from the common database) to evaluate an initial quality prognosis without waiting for returned materials or samples to arrive and conducting the tests themselves. Response times are dramatically reduced by utilizing the systems and methods disclosed herein.

In on embodiment, a shared database (or datastore) may include the following stored elements:

Central database for device definition, test setup and results collection.
  CT stations typically connect to a single shared database for live, on-line operations and centralized data storage.
  Optionally, independent field stations may maintain a local database that will be synchronized with the central database in situations where a live connection to the central database is not feasible.
Design (device type) level data
Test setup and configuration. One-time setup per design, all CT stations share configuration data to ensure consistent test execution and data collection.
Includes both Curve Trace test setup as well as Continuity/DC Test setup.
Test setups may be defined by engineering and pushed out to CT field stations, field technicians will not need to be aware of setup and configuration issues.
Device test results
Test results are stored in central database.
Prior test results may be viewed at any time on any CT station with access to the central database.
Accumulation of test result data allows failure analysis over arbitrary selections of test result sets (ex: by customer, facility, date-range, etc., as well as combinations of selection criteria).
User defined metadata
Users may supplement the standard application metadata at the design and device level by defining additional data fields to be captured for each returned device. This additional data may be used for additional selection criteria for reporting and analysis. Examples include customer IDs, production information such as lot or batch IDs, RMA numbers, test operator, station and facility IDs, etc. In theory any additional information the customer wishes to capture for a device may be added to the CT database.

Systems, software and processes as described above can provide various benefits to users including without limitation the following:

Enable local field offices to—
Provide rapid RMA screening in the field
Field office access to run device diagnostics
Enable IC manufacturers to—
Rapid customer response to quality concerns
Eliminate false alarms
Differentiate use versus quality issues
Provide initial quality prognosis to the factory
Offload screening from the Factory FA
Provide to IC customers—
Tight feedback loop
Immediate response time to RMAs
Higher confidence in the quality of your product It should be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

It will be obvious to those having skill in the art that many changes may be made to the details of the above-described embodiments without departing from the underlying principles of the invention. The scope of the present invention should, therefore, be determined only by the following claims.

The invention claimed is:

1. A method for testing a semiconductor device, the method comprising:
   reading a pinmap file associated with the semiconductor device;
   for pins to be tested, creating a first test set comprising second individual tests that include a pin to ground curve trace, a checkerboard curve trace, an automatic pin to pin curve trace, and an interactive pin to pin curve trace;
   wherein the pins to be tested comprise a portion of a set of pins identified in the pinmap file;
   routing data channels associated with the semiconductor device to the pins to be tested;
   responsive to said routing, executing the first test set;
   accessing golden data associated with the semiconductor device;
   determining at least one allowable variance from the golden data responsive to a result of the execution of the first test set;
   detecting any of the pins of the portion of the set of pins whose curves exceed the allowable variance from the golden data, and flagging the detected pins as failing pins;
   running a selected one of the second individual tests on only the set of failing pins, wherein the selected test of the second individual tests comprises the automatic pin to pin curve trace; and
   for each pin in the set of failing pins, setting the pin to 0 and all other pins to X;
      defining the pin set to 0 as a reference pin;
      curve tracing each of the test pins relative to the reference pin; and
      presenting the test results to a screen display.

2. The method of claim 1, wherein presenting the test results to the screen display includes:
   generating an individual CT plot of each pin to pin curve trace test;
   overlaying the CT curve from each test pin on the plot;
   overlaying the corresponding golden data on the plot; and
   displaying, on the screen display, the resulting composite display in a graphical user interface.

3. The method of claim 2, and further comprising highlighting a failing portion of the curve in the display with a vertical overlay.

4. The method of claim 1, wherein the routing the data channels associated with the semiconductor device to the pins to be tested is performed using a level shifter board.

5. A method for testing a semiconductor device, the method comprising:
   reading a pinmap file associated with the semiconductor device;
   for the pins to be tested, creating a first test set comprising a plurality of second individual tests selected from the group comprising a pin to ground curve trace, a checkerboard curve trace, an automatic pin to pin curve trace, and an interactive pin to pin curve trace; and
   wherein the pins to be tested comprise a portion of a set of pins identified in the pinmap file;
   routing data channels associated with the semiconductor device to the pins to be tested;
   responsive to said routing, executing the first test set;
   accessing golden data associated with the semiconductor device;
   determining at least one allowable variance from the golden data responsive to a result of the execution of the first test set;
   detecting any of the pins of the portion of the set of pins whose curves exceed the allowable variance from the golden data, and flagging the detected pins as failing pins; and
   running a selected one of the second individual tests on only the set of failing pins, wherein the selected test of the second individual tests comprises the automatic pin to pin curve trace; and
   for each pin in the set of failing pins, setting the pin to 0 and all other pins to X;
      defining the pin set to 0 as a reference pin;
      curve tracing each of the test pins relative to the reference pin; and
      presenting the test results to a screen display.

6. The method of claim 5, wherein presenting the test results to the screen display includes:
   generating an individual CT plot of each pin to pin curve trace test;
   overlaying the CT curve from each test pin on the plot;
   overlaying the corresponding golden data on the plot; and
   displaying, on the screen display, the resulting composite display in a graphical user interface.

7. The method of claim 6, and further comprising highlighting a failing portion of the curve in the display with a vertical overlay.

8. The method of claim 5, wherein the data channels comprise tester channels of a level shifter board.

9. The method of claim 5, wherein the pinmap maps the pins of the set to resources of a tester, and wherein the routing the data channels associated with the semiconductor device to the pins to be tested is performed using the tester.

* * * * *